(12) United States Patent
Richez

(10) Patent No.: US 11,975,478 B2
(45) Date of Patent: May 7, 2024

(54) FLOW CELLS

(71) Applicant: ILLUMINA CAMBRIDGE LIMITED, Cambridge (GB)

(72) Inventor: Alexandre Richez, Cambridge (GB)

(73) Assignee: Illumina Cambridge Limited, Cambridge (GB)

( * ) Notice: Subject to any disclaimer, the term of this patent is extended or adjusted under 35 U.S.C. 154(b) by 160 days.

(21) Appl. No.: 17/235,244

(22) Filed: Apr. 20, 2021

(65) Prior Publication Data

US 2021/0339457 A1 Nov. 4, 2021

Related U.S. Application Data

(60) Provisional application No. 63/015,259, filed on Apr. 24, 2020.

(51) Int. Cl.
*B29C 59/02* (2006.01)
*B01L 3/00* (2006.01)
*B29C 59/00* (2006.01)
*C08G 59/06* (2006.01)
*C08G 59/22* (2006.01)
*C08G 59/32* (2006.01)
(Continued)

(52) U.S. Cl.
CPC .......... *B29C 59/022* (2013.01); *B01L 3/5027* (2013.01); *B29C 59/005* (2013.01); *B29C 59/026* (2013.01); *C08G 59/063* (2013.01); *C08G 59/22* (2013.01); *C08G 59/32* (2013.01); *C08G 77/045* (2013.01); *G01N 15/1436* (2013.01); *B01L 2300/0896* (2013.01); *B29K 2063/00* (2013.01); *B29K 2083/00* (2013.01); *B82Y 30/00* (2013.01); *B82Y 35/00* (2013.01); *B82Y 40/00* (2013.01); *C08G 2270/00* (2013.01)

(58) Field of Classification Search
CPC ... B29C 59/022; B29C 59/005; B29C 59/026; B01L 2300/0896; G01N 15/1436; B29K 2063/00; B29K 2083/00; B82Y 30/00; B82Y 35/00; B82Y 40/00; C08G 59/063; C08G 59/22; C08G 59/32; C08G 77/045; C08G 2270/00
See application file for complete search history.

(56) References Cited

U.S. PATENT DOCUMENTS

| 5,110,867 A | 5/1992 | Schutyser et al. |
| 9,995,683 B2 * | 6/2018 | Chiou .................. B82Y 15/00 |

(Continued)

FOREIGN PATENT DOCUMENTS

| CN | 101984756 A | 3/2011 |
| CN | 102713572 A | 10/2012 |

(Continued)

*Primary Examiner* — Jane L Stanley
(74) *Attorney, Agent, or Firm* — Dierker & Kavanaugh, P.C.

(57) ABSTRACT

An example of a flow cell includes a substrate and a cured, patterned resin on the substrate. The cured, patterned resin has nano-depressions separated by interstitial regions. Each nano-depression has a largest opening dimension ranging from about 10 nm to about 1000 nm. The cured, patterned resin also includes an interpenetrating polymer network. The interpenetrating polymer network of the cured, patterned resin includes an epoxy-based polymer and a (meth)acryloyl-based polymer.

12 Claims, 5 Drawing Sheets

(51) Int. Cl.
*C08G 77/04* (2006.01)
*G01N 15/1434* (2024.01)
*B29K 63/00* (2006.01)
*B29K 83/00* (2006.01)
*B82Y 30/00* (2011.01)
*B82Y 35/00* (2011.01)
*B82Y 40/00* (2011.01)

(56) References Cited

U.S. PATENT DOCUMENTS

| | | | |
|---|---|---|---|
| 2003/0027328 A1* | 2/2003 | Cunningham | G01N 21/4788 435/7.9 |
| 2003/0104313 A1 | 6/2003 | Lawton | |
| 2004/0023145 A1 | 2/2004 | Moussa et al. | |
| 2007/0092733 A1 | 4/2007 | Yang et al. | |
| 2011/0306143 A1* | 12/2011 | Chiou | G01N 21/7703 422/82.11 |
| 2013/0288357 A1* | 10/2013 | Tiefenthaler | G02B 6/32 422/69 |
| 2014/0272719 A1* | 9/2014 | Liu | G01N 33/54373 430/322 |
| 2015/0005447 A1* | 1/2015 | Berti | C12Q 1/6837 427/302 |
| 2016/0023208 A1* | 1/2016 | Fisher | B29C 65/1467 156/272.8 |
| 2016/0122816 A1* | 5/2016 | Brown | C08F 220/56 526/306 |
| 2018/0327832 A1* | 11/2018 | Ramirez | C12Q 1/6806 |
| 2020/0024661 A1 | 1/2020 | Merkel et al. | |
| 2020/0025670 A1 | 1/2020 | Merkel et al. | |

FOREIGN PATENT DOCUMENTS

| | | |
|---|---|---|
| CN | 106886127 A | 6/2017 |
| WO | 2020005503 A1 | 1/2020 |
| WO | 2020018801 A1 | 1/2020 |

* cited by examiner

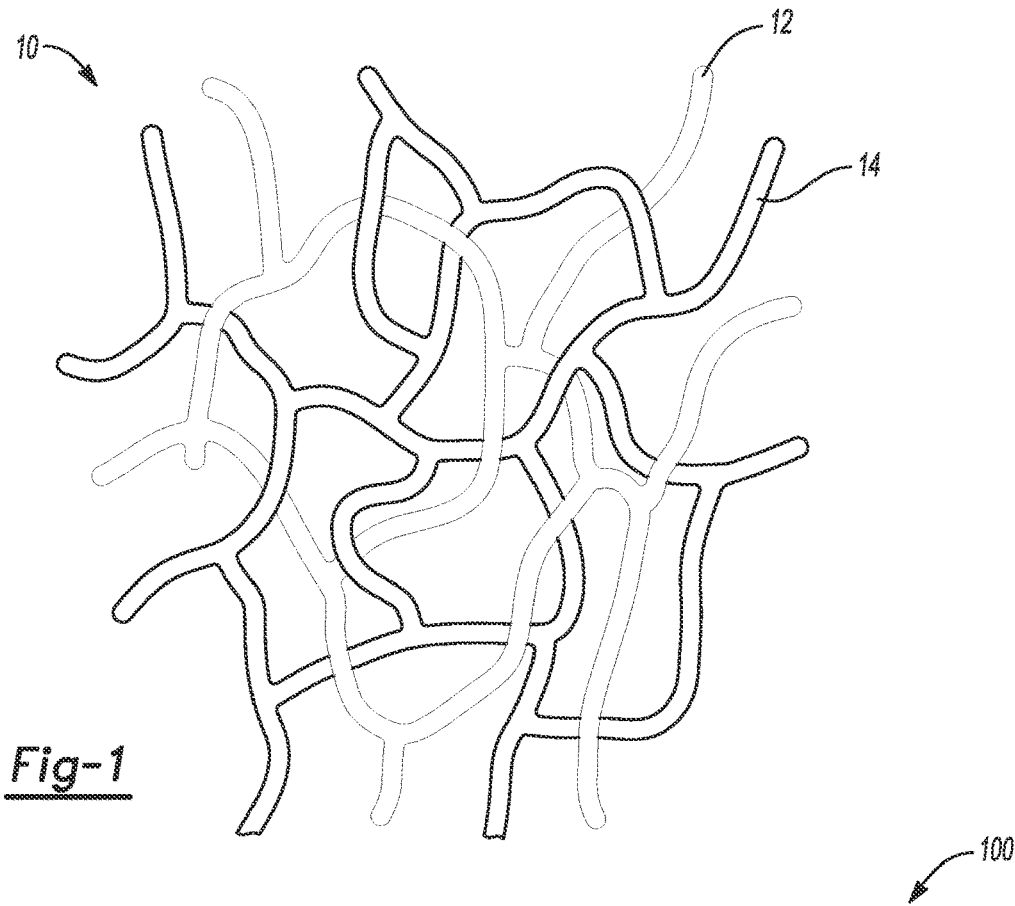

Fig-1

```
┌─────────────────────────────────────────────────────────────────┐
│ Mixing a Cationically Polymerizable Monomer and a Free Radical  │─ 102
│ Polymerizable Monomer to Form a Resin Mixture, wherein the      │
│ Resin Mixture is a Precursor to an Interpenetrating Polymer     │
│ Network that is to be Incorporated into a Flow Cell             │
└─────────────────────────────────────────────────────────────────┘
                                │
                                ▼
┌─────────────────────────────────────────────────────────────────┐
│ Adjusting a Weight Ratio of the Cationically Polymerizable      │
│ Monomer and the Free Radical Polymerizable Monomer Based on a   │
│ Property to be Imparted to the Resin Mixture or the             │
│ Interpenetrating Polymer Network, the Property being Selected   │
│ from the Group Consisting of Refractive Index of the            │
│ Interpenetrating Polymer Network, Absorption of the             │─ 104
│ Interpenetrating Polymer Network, Hardness of the               │
│ Interpenetrating Polymer Network, Thickness of the              │
│ Interpenetrating Polymer Network, Hydrophilic/Hydrophobic       │
│ Balance of the Interpenetrating Polymer Network, Viscosity of   │
│ the Resin Mixture, Surface Chemistry Compatibility of the Resin │
│ Mixture with a Working Stamp, Surface Chemistry Compatibility   │
│ of the Interpenetrating Polymer Network, Shrinkage of the       │
│ Interpenetrating Polymer Network, and Combinations thereof      │
└─────────────────────────────────────────────────────────────────┘
                                │
                                ▼
┌─────────────────────────────────────────────────────────────────┐
│ Patterning the Resin Mixture to Form the Interpenetrating       │─ 106
│ Polymer Network                                                 │
└─────────────────────────────────────────────────────────────────┘
```

Fig-2

FLOW CELLS

CROSS-REFERENCE TO RELATED APPLICATIONS

This application claims the benefit of U.S. Provisional Application Ser. No. 63/015,259, filed Apr. 24, 2020, the contents of which is incorporated by reference herein in its entirety.

BACKGROUND

Nano-imprinting technology enables the economic and effective production of nanostructures. Nano-imprint lithography employs direct mechanical deformation of a resist material by a stamp having nanostructures. The resist material is cured while the stamp is in place to lock the shape of the nanostructures in the resist material.

INTRODUCTION

In a first aspect, a flow cell comprises a substrate; and a cured, patterned resin on the substrate, the cured, patterned resin including nano-depressions separated by interstitial regions, the nano-depressions each having a largest opening dimension ranging from about 10 nm to about 1000 nm, and the cured, patterned resin including an interpenetrating polymer network including an epoxy-based polymer and a (meth)acryloyl-based polymer.

An example of the first aspect further comprises a grating layer positioned on the substrate; and a planar waveguide layer positioned on the grating layer. In one example, a refractive index of the interpenetrating polymer network ranges from about 1.35 to about 1.52; and a refractive index of the planar waveguide layer ranges from about 1.6 to about 2.5.

An example of the first aspect further comprises a hydrogel positioned in each of the nano-depressions; and amplification primers attached to the hydrogel.

In an example of the first aspect, a thickness of the cured, patterned resin ranges from about 225 nm to about 600 nm.

In an example of the first aspect, wherein a weight ratio of the epoxy-based polymer to the (meth)acryloyl-based polymer ranges from 25:75 to about 75:25.

It is to be understood that any features of the flow cell disclosed herein may be combined together in any desirable manner and/or configuration to achieve the benefits as described in this disclosure, including, for example, having an imprinted layer with one or more tuned properties.

In a second aspect, a method comprises applying a resin mixture on a substrate, the resin mixture including two independently cross-linkable monomers present in the resin mixture at a predetermined weight ratio, a first of the two independently cross-linkable monomers being a cationically polymerizable monomer and a second of the two independently cross-linkable monomers being a free radical polymerizable monomer; imprinting the resin mixture with a working stamp having a plurality of nano-features; and curing the resin mixture while the working stamp is in place, thereby forming an interpenetrating polymer network imprinted with flow cell nano-depressions.

In an example of the second aspect, the cationically polymerizable monomer is a multi-functional epoxy monomer and wherein the free radical polymerizable monomer is a multi-functional (meth)acryloyl monomer. In one example, the multi-functional epoxy monomer is selected from the group consisting of:

i) 2,4,6,8-tetramethyl-2,4,6,8-tetrakis(propyl glycidyl ether) cyclotetrasiloxane:

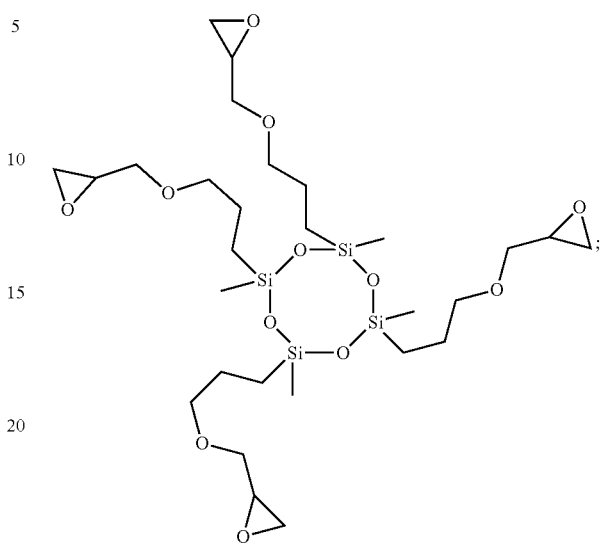

ii) Tetrakis(epoxycyclohexyl ethyl)tetramethyl cyclotetrasiloxane:

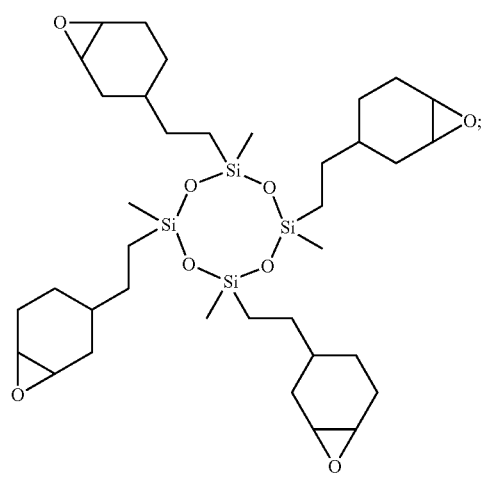 [SMILES: C[Si]1(CCC2CCC3OC3C2)O[Si](C)(CCC2CCC3OC3C2)O[Si](C)(CCC2CCC3OC3C2)O[Si](C)(CCC2CCC3OC3C2)O1]

iii) Poly(dimethylsiloxane), diglycidyl ether terminated:

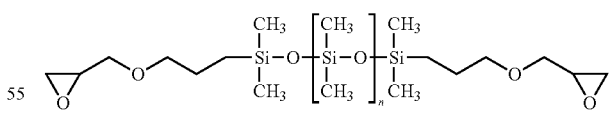

wherein 4<n<8;

iv) Polypropylene glycol) diglycidyl ether:

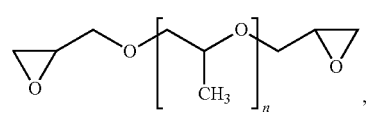

wherein 5<n<10;
v) 3,4-Epoxycyclohexylmethyl 3,4-epoxycyclohexanecarboxylate:

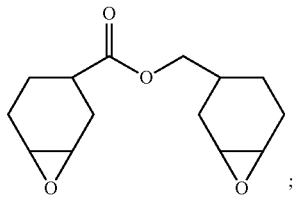 [SMILES: O=C(OCC1CCC2OC2C1)C1CCC2OC2C1]

vi) Bisphenol A diglycidyl ether, brominated:

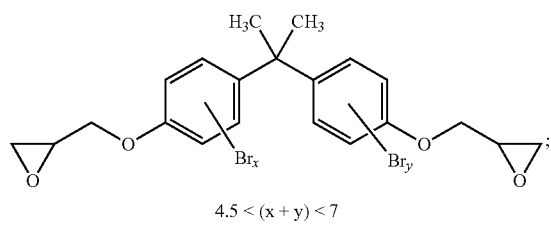

4.5 < (x + y) < 7 vii) Poly(Bisphenol A-co-epichlorohydrin), glycidyl end-capped:

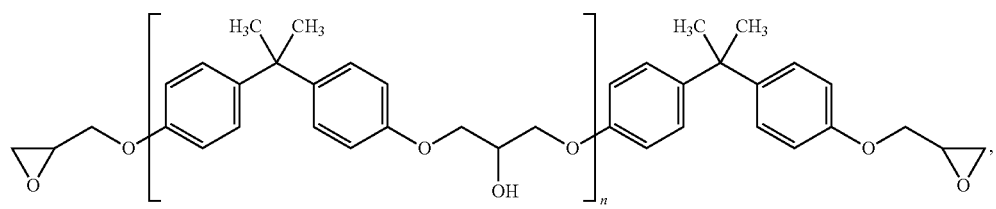

wherein 0<n<2;
viii) Bisphenol A propoxylate diglycidyl ether:

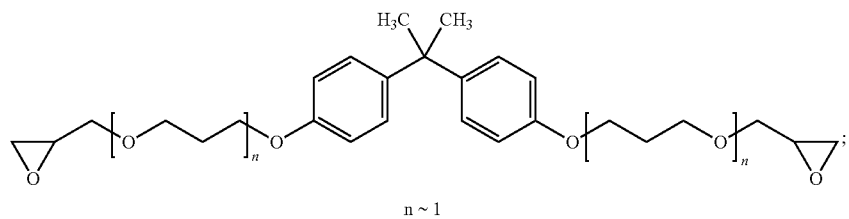

n ~ 1 ix) Monophenyl functional tris(epoxy terminated polydimethylsiloxane):

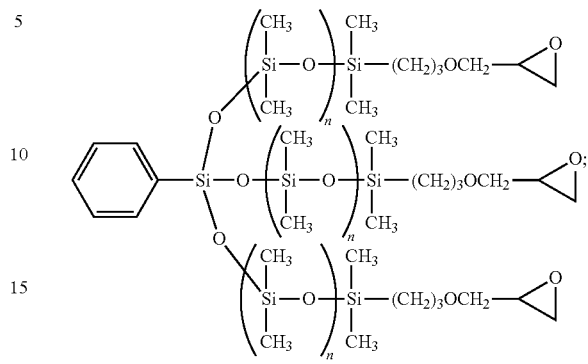

x) Trimethylolpropane triglycidyl ether:

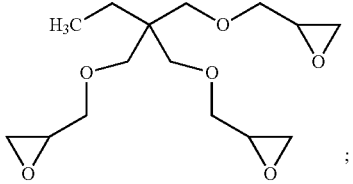 [SMILES: CCC(COCC1CO1)(COCC1CO1)COCC1CO1]

xi) 2,2'-(2,2,3,3,4,4,5,5-Octafluorohexane-1,6-diyl)bis(oxirane):

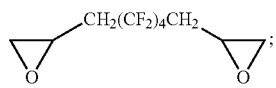

xii) 1,3-Bis(3-glycidoxypropyl)tetramethyldisiloxane:

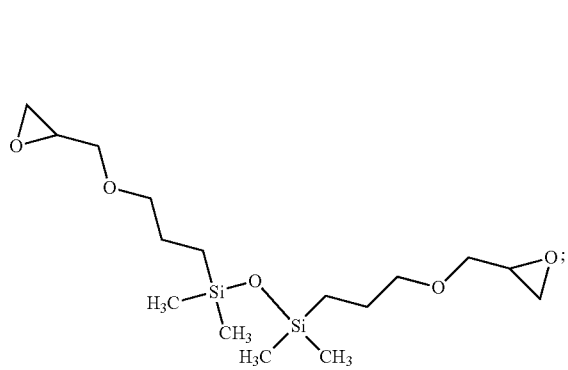 [SMILES: C[Si](C)(CCCOCC1CO1)O[Si](C)(C)CCCOCC1CO1]

xiii) 1,3 Bis[2(3,4 epoxycyclohex-1-yl)ethyl]tetra-methyld-isiloxane:

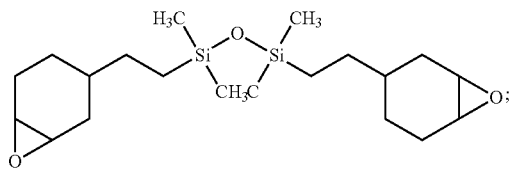 [SMILES: C[Si](C)(CCC1CCC2OC2C1)O[Si](C)(C)CCC1CCC2OC2C1]

xiv) Glycidyl polyoctahedral silsesquioxane:

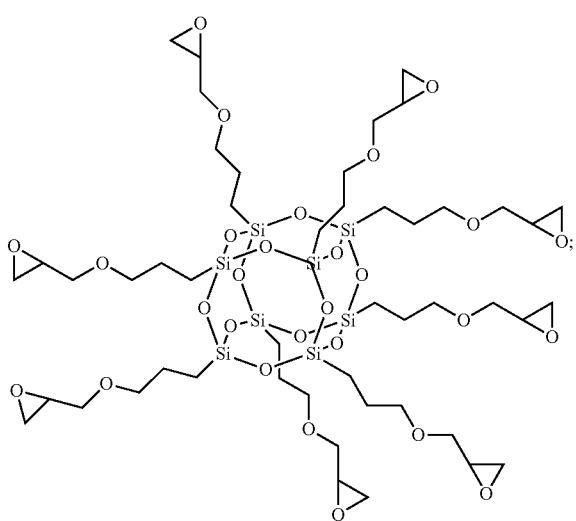

xv) Epoxycyclohexyl polyoctahedral silsesquioxane:

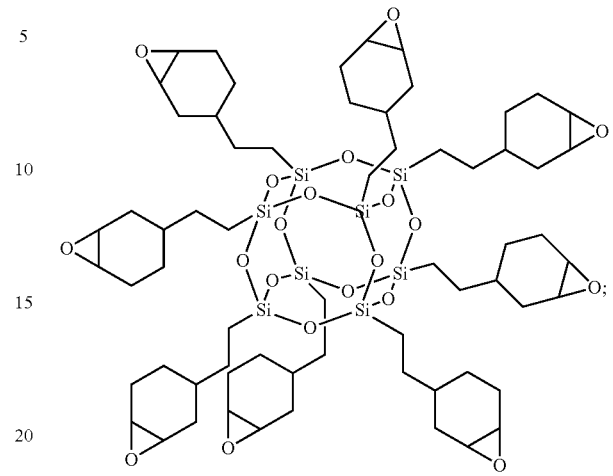

xvi) Tris(4-hydroxyphenyl)methane triglycidyl ether

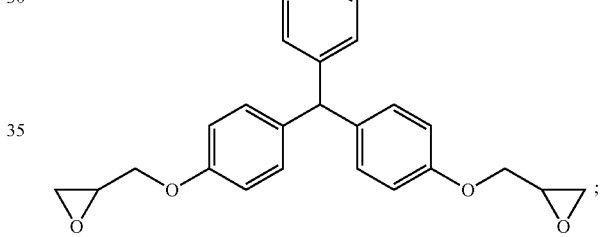

xvii) 4,4'-Methylenebis(N,N-diglycidylaniline)

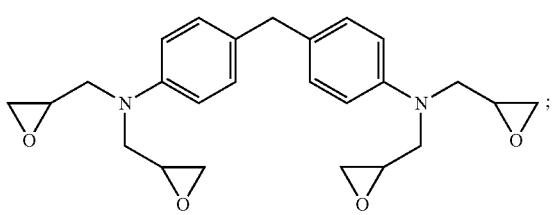 [SMILES: c1cc(N(CC2CO2)CC2CO2)ccc1Cc1ccc(N(CC2CO2)CC2CO2)cc1]

and xviii) any combination of i) through xvii). In another example, the multi-functional (meth)acryloyl monomer is selected from the group consisting of:

i) 2,2,3,3,4,4,5,5-octafluoro-1,6-hexanediol diacrylate:

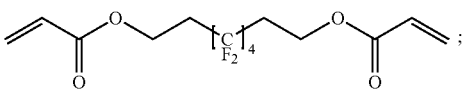

ii) Pentaerythritol tetraacrylate:

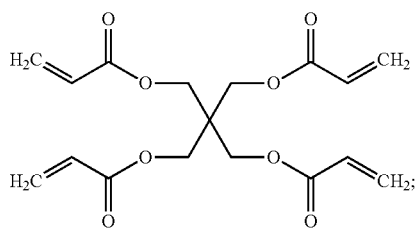 [SMILES: C=CC(=O)OCC(COC(=O)C=C)(COC(=O)C=C)COC(=O)C=C]

iii) Pentaerythritol triacrylate:

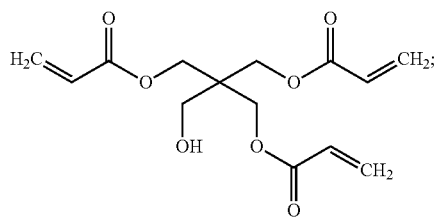 [SMILES: C=CC(=O)OCC(CO)(COC(=O)C=C)COC(=O)C=C]

iv) Glycerol 1,3-diglycerolate diacrylate:

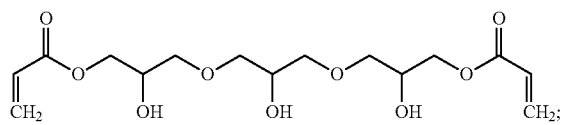 [SMILES: C=CC(=O)OCC(O)COCC(O)COCC(O)COC(=O)C=C]

v) Poly(ethylene glycol) dimethacrylate:

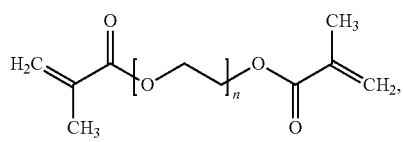

wherein 8<n<10;
vi) Glycerol dimethacrylate, mixture of isomers:

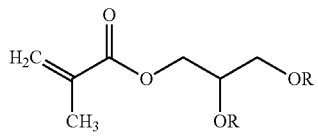

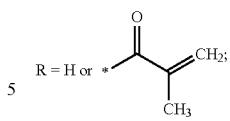

R = H or * vii) 3-(Acryloyloxy)-2-hydroxypropyl methacrylate:

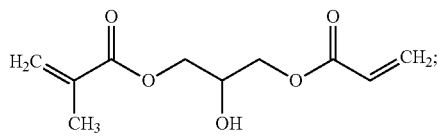

viii) Ethylene glycol dimethacrylate:

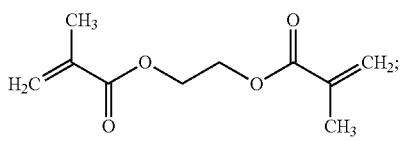

ix) Bis(2-methacryloyl)oxyethyl disulfide:

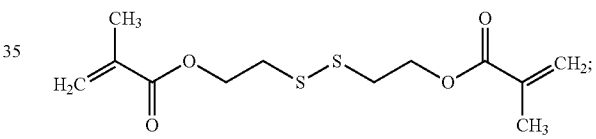

x) Tricyclodecane dimethanol diacrylate:

xi) Bisphenol A glycerolate (1 glycerol/phenol) diacrylate:

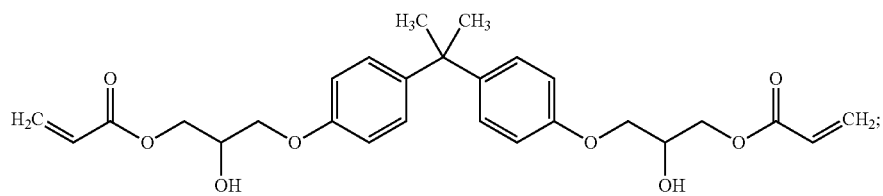 [SMILES: C=CC(=O)OCC(O)COc1ccc(C(C)(C)c2ccc(OCC(O)COC(=O)C=C)cc2)cc1]

xii) Bisphenol A dimethacrylate:

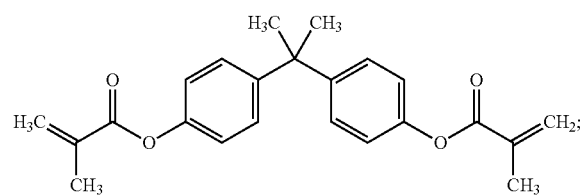 [SMILES: C=C(C)C(=O)Oc1ccc(C(C)(C)c2ccc(OC(=O)C(=C)C)cc2)cc1]

xiii) Methacryloxypropyl terminated polydimethylsiloxane:

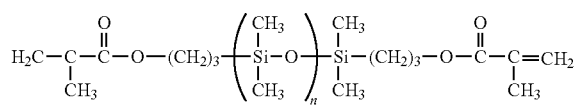

wherein n is selected to render the monomer with a molecular weight of about 420 g/mol, 950 g/mol, 4,000 g/mol, 10,000 g/mol, or 25,000 g/mol;

xiv) Zirconium bromonorbornanelactone carboxylate triacrylate:

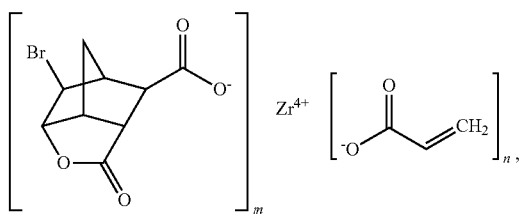

wherein m ranges from 0 to 4, n ranges from 0 to 4, and m+n=4;

xv) Zirconium acrylate:

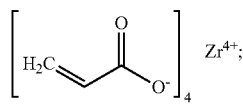

xvi) Hafnium carboxyethyl acrylate:

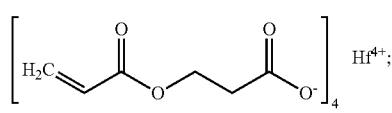

xvii) Acrylo polyoctahedral silsesquioxane:

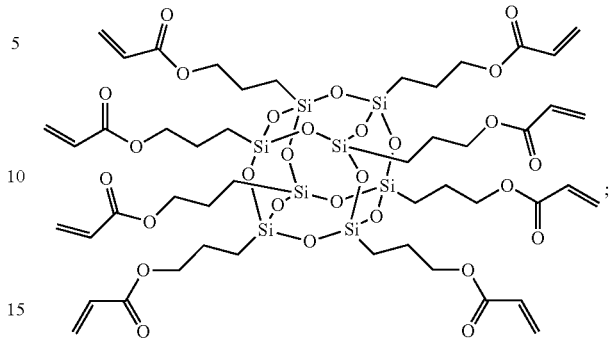

xviii) Methacryl polyoctahedral silsesquioxane:

xix) 2,4,6,8-Tetramethyl-2,4,6,8-tetrakis(3-acryloyloxypropyl) cyclotetrasiloxane:

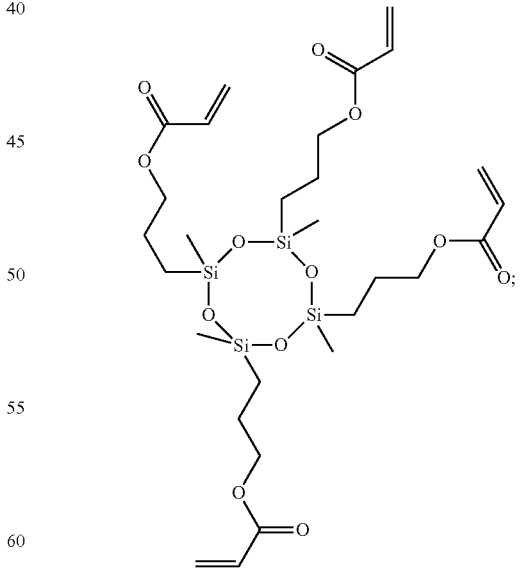

and xx) any combination of i) through xix).

In one example of the second aspect, the multi-functional epoxy monomer is poly(propylene glycol) diglycidyl ether:

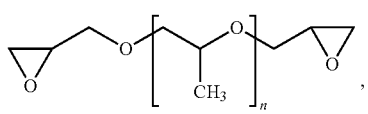

the multi-functional (meth)acryloyl monomer is 2,2,3,3,4,4,5,5-octafluoro-1,6-hexanediol diacrylate:

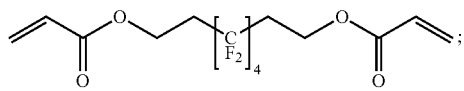

and the predetermined weight ratio is about 50:50.

In one example of the second aspect, the multi-functional epoxy monomer is Poly(propylene glycol) diglycidyl ether:

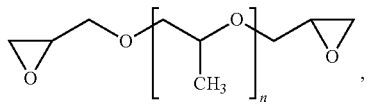

the multi-functional (meth)acryloyl monomer is Glycerol 1,3-diglycerolate diacrylate:

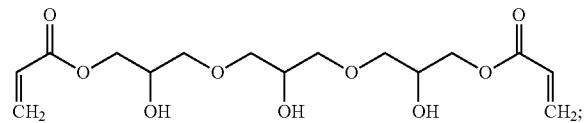 [SMILES: C=CC(=O)OCC(O)COCC(O)COCC(O)COC(=O)C=C]

and the predetermined weight ratio ranges from about 25:75 to about 75:25.

It is to be understood that any features of this method may be combined together in any desirable manner. Moreover, it is to be understood that any combination of features of the method and/or of the flow cell may be used together, and/or combined with any of the examples disclosed herein to achieve the benefits as described in this disclosure, including, for example, to tune one or more properties of an imprinted layer.

In a third aspect, a method comprises mixing a cationically polymerizable monomer and a free radical polymerizable monomer to form a resin mixture, wherein the resin mixture is a precursor to an interpenetrating polymer network that is to be incorporated into a flow cell; adjusting a weight ratio of the cationically polymerizable monomer and the free radical polymerizable monomer using at least a property to be imparted to the resin mixture or the interpenetrating polymer network, the property being selected from the group consisting of refractive index of the interpenetrating polymer network, absorption of the interpenetrating polymer network, hardness of the interpenetrating polymer network, thickness of the interpenetrating polymer network, hydrophilic/hydrophobic balance of the interpenetrating polymer network, viscosity of the resin mixture, surface chemistry compatibility of the resin mixture with a working stamp, surface chemistry compatibility of the interpenetrating polymer network, shrinkage of the interpenetrating polymer network, and combinations thereof; and patterning the resin mixture to form the interpenetrating polymer network.

In an example of the third aspect, the cationically polymerizable monomer is an epoxy siloxane monomer and wherein the free radical polymerizable monomer is a (meth) acryloyl monomer.

In an example of the third aspect, the desired property is the surface chemistry compatibility of the resin mixture with the working stamp; the method further comprises selecting a material of the working stamp; and the weight ratio of the cationically polymerizable monomer and the free radical polymerizable monomer is adjusted to be within a range of from about 25:75 to about 75:25.

In an example of the third aspect, the patterning involves nanoimprint lithography.

It is to be understood that any features of this method may be combined together in any desirable manner. Moreover, it is to be understood that any combination of features of the method and/or of the other method and/or of the flow cell may be used together, and/or combined with any of the examples disclosed herein to achieve the benefits as described in this disclosure, including, for example, to tune one or more properties of an imprinted layer.

BRIEF DESCRIPTION OF THE DRAWINGS

Features of examples of the present disclosure will become apparent by reference to the following detailed description and drawings, in which like reference numerals correspond to similar, though perhaps not identical, components. For the sake of brevity, reference numerals or features having a previously described function may or may not be described in connection with other drawings in which they appear.

FIG. 1 is a schematic illustration of an example of an interpenetrating polymer network;

FIG. 2 is a flow diagram depicting an example method for making an example of an interpenetrating polymer network;

DETAILED DESCRIPTION

Figure 3A:
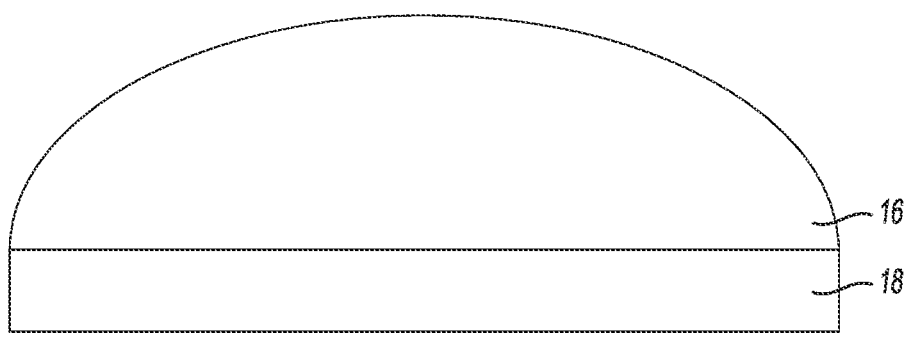
FIGS. 3A through 3C are schematic illustrations of an example of a method for making a cured, patterned resin.

Patterning technology has been used to create individual depressions in flow cell surfaces. The depressions may be functionalized, for example, with capture primers. Within each of the functionalized depressions, monoclonal populations (localized and independent clusters) of amplicons can be generated from respective genetic oligonucleotide fragments. A higher cluster density may be obtained when the depressions have small dimensions and a low pitch (e.g., the spacing from the center of one depression to the center of an adjacent or nearest neighboring depression or from the edge of one depression to the edge of an adjacent or nearest neighboring depression). Higher cluster density means that more bases can be read from a given unit area, which increases the genetic yield from the patterned flow cell.

Nanoimprint lithography (NIL) is one example of a high-throughput patterning technique that can enable high precision and lower costs, than, for example, patterning techniques using photons or electrons. NIL utilizes a working stamp to create features a curable resin mixture.

Some resin mixtures are easily imprintable, but do not have properties that are suitable for use in flow cells. For example, some cured resins have compositions that react undesirably when exposed to sequencing chemicals. Other resin mixtures are difficult to imprint. For example, resins that are meant to adhere upon curing may not readily release from a working stamp. Some resins may also become more difficult to imprint when the feature size and/or spacing between the features gets smaller (e.g., as size and/or spacing is less than 500 nm). As one example, some resins that can replicate large features e.g., greater than 1 µm, but may generate defects that clog and/or cap the features as the feature size is reduced.

Examples of the resin mixture disclosed herein cure to form an interpenetrating polymer network. The formulation of the resin mixture may be modified so that one or more properties of the resin mixture are tuned for a particular application, including, e.g., imprinting, and/or one or more properties of the resulting interpenetrating polymer network are tuned for a particular application, e.g., flow cell sequencing. As an example, the viscosity of the resin formulation may be tuned for ease of processability and/or reflow (the time it takes to fill up all of the working stamp features with the resin formulation by applying a reasonable pressure (e.g., with a roller weight)). As another example, the wettability of the resin formulation may be tuned to enhance the compatibility of the formulation with a particular working stamp material and/or with a particular substrate material. As still other examples, the hydrophilic/hydrophobic balance, the thickness, the refractive index, the surface properties (e.g., stickiness, chemical resistance, etc.), the shrinkage, and/or the hardness of the resulting interpenetrating polymer network may be tuned for a particular application. As one specific example, the resin mixture formulation may be adjusted to generate an interpenetrating polymer network with a refractive index that is suitable for use with a planar waveguide in a flow cell. As another specific example, the resin mixture formulation may be adjusted to generate an interpenetrating polymer network with a surface property that cleanly releases the working stamp after curing. Other properties, such as the autofluorescence of the interpenetrating polymer network may be tuned by selecting a particular initiator to be included in the resin mixture. Targeting a specific property for the final resin and/or the resulting interpenetrating polymer network may dictate the components of the resin mixture, and the amount of each component of the resin mixture.

For the flow cell applications disclosed herein, the resulting interpenetrating polymer network is also capable of polymer attachment and other surface modification processes that introduce the desired surface chemistry for sequencing.

Definitions

Terms used herein will be understood to take on their ordinary meaning in the relevant art unless specified otherwise. Several terms used herein and their meanings are set forth below.

As used herein, the singular forms "a," "an," and "the" refer to both the singular as well as plural, unless the context clearly indicates otherwise.

The term "comprising" as used herein is synonymous with "including," "containing," or "characterized by," and is inclusive or open-ended and does not exclude additional, unrecited elements or method steps.

The terms "substantially" and "about" used throughout this disclosure, including the claims, are used to describe and account for small fluctuations, such as due to variations in processing. For example, these terms can refer to less than or equal to ±10% from a stated value, such as less than or equal to ±5% from a stated value, such as less than or equal to ±2% from a stated value, such as less than or equal to ±1% from a stated value, such as less than or equal to ±0.5% from a stated value, such as less than or equal to ±0.2% from a stated value, such as less than or equal to ±0.1% from a stated value, such as less than or equal to ±0.05% from a stated value.

An "acryloyl" is an enone with the structure $H_2C=CH-C(=O)-O-R$, where R may be an alkyl chain, a phenyl chain (bisphenol for example), a fluorinated carbon chain, an alcohol, a glycol chain, a siloxane chain (dimethylsiloxane, cyclosiloxane, etc.). The acryloyl may be part of a mono- or multi-functional molecule or metallic complex (Zirconium or Hafnium complexes for examples). The acryloyl group may also be a methacryloyl, with a methyl group in place of the single hydrogen atom at the $C=C$ bond. When the term "(meth)acryloyl" is used, it is meant that the group may be either the acryloyl or the methacryloyl. A (meth)acryloyl-based polymer is a homopolymer or copolymer of (meth)acryloyl monomer units.

A "cationically polymerizable monomer" is a monomer whose polymerization and/or cross-linking is initiated by cations.

The term "depositing," as used herein, refers to any suitable application technique, which may be manual or automated, and, in some instances, results in modification of the surface properties. Generally, depositing may be performed using vapor deposition techniques, coating techniques, grafting techniques, or the like. Some specific examples include chemical vapor deposition (CVD), spray coating (e.g., ultrasonic spray coating), spin coating, dunk or dip coating, doctor blade coating, puddle dispensing, flow through coating, aerosol printing, screen printing, microcontact printing, inkjet printing, or the like.

As used herein, the terms "depression" and "nano-depression" refers to a discrete concave feature in a patterned resin of the interpenetrating polymer network. The nano-depressions are imprinted features which are transferred from a working stamp during a nano-imprinting process, and thus are a negative replica of the working stamp nano-features. Each nano-depression has a largest opening dimension (e.g., diameter or length depending on the shape) ranging from about 10 nm to about 1000 nm. In some examples, the largest opening dimension is a diameter or length ranging from about 25 nm to about 750 nm, e.g., from about 50 nm to about 500 nm, from about 40 nm to about 400 nm, etc. The largest opening is at least partially surrounded by interstitial region(s) of the resin. Depressions can have any of a variety of shapes at their opening in a surface including, as examples, round, elliptical, square, polygonal, star shaped (with any number of vertices), etc. The cross-section of a depression taken orthogonally with the surface can be curved, square, polygonal, hyperbolic, conical, angular, etc The term "each," when used in reference to a collection of items, is intended to identify an individual item in the collection, but does not necessarily refer to every item in the collection. Exceptions can occur if explicit disclosure or context clearly dictates otherwise.

The term "epoxy" (also referred to as a glycidyl or oxirane group) as used herein refers to

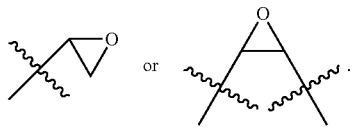

An epoxy-based polymer is a homopolymer or copolymer of epoxy monomer units.

A "feature," as used herein, refers to a point or area in a pattern that can be distinguished from other points or areas according to relative location. Example features include the depressions in a patterned resin, projections of a working stamp, etc. The term "nano-feature" is specifically used to describe the features of a working stamp that are to be transferred to a resin mixture. The nano-features are part of a pattern, and during imprinting, a negative replica of the pattern is generated in the imprinted material. For example, a nano-feature may be a nano-protrusion that generates a nano-depression during imprinting. Each nano-protrusion has a largest dimension that corresponds with the largest opening dimension of the nano-depression that is to be imprinted, and in some examples ranges from about 10 nm to about 1000 nm.

As used herein, the term "flow cell" is intended to mean a vessel having a chamber (e.g., flow channel) where a reaction can be carried out, an inlet for delivering reagent(s) to the chamber, and an outlet for removing reagent(s) from the chamber. In some examples, the chamber enables the detection of the reaction that occurs in the chamber. For example, the chamber/flow channel can include one or more transparent surfaces allowing for the optical detection of arrays, optically labeled molecules, or the like, at the nano-depression(s).

A "free radical polymerizable monomer" is a monomer whose polymerization and/or cross-linking is initiated by free radicals.

As used herein, the term "independently cross-linkable monomers" refers to two or more different monomers that that respectively react and cross-link without cross-linking to each other. The two or more different monomers are miscible with each other, so that the respective polymerization and cross-linking reactions occur in the same phase. This ensures that the respectively cross-linked polymers become entangled and locked in an interpenetrating network. In contrast, immiscible monomer systems would result in phase separation, and the polymerization and cross-linking reactions would occur in the separate phases. This would result in cross-linked polymers being physically separated in the two phases.

In the examples disclosed herein, the independently cross-linkable monomers can be polymerized and cross-linked simultaneously or sequentially (but in the same phase).

As used herein, the term "interstitial region" refers to an area on a surface (e.g., of a substrate, patterned resin, etc.) that separates features. For example, an interstitial region can separate one feature of an array from another feature of an array or pattern. The two features that are separated from each other can be discrete, i.e., lacking physical contact with each other. In another example, an interstitial region can separate a first portion of a feature from a second portion of a feature. In many examples, the interstitial region is continuous, whereas the features are discrete, for example, as is the case for a plurality of nano-depressions defined in an otherwise continuous surface. The separation provided by an interstitial region can be partial or full separation. Interstitial regions may have a surface material that differs from the surface material of the features defined in the surface. For example, features of a flow cell array can have an amount or concentration of a polymer coating and primer(s) that exceeds the amount or concentration present at the interstitial regions. In some examples, the polymer coating and primer(s) may not be present at the interstitial regions.

An "interpenetrating polymer network" refers to two or more individual polymer networks which are at least partially interlaced, but not cross-linked to each other. The two or more individual polymer networks are mechanically connected through the physical intertwining and entanglement of their polymer chains, and thus and cannot be separated unless chemical bonds in one or both of the individual networks are broken. Each of the individual polymer networks is cross-linked; however, the two or more individual polymer networks are not covalently bonded (e.g., not cross-linked) to each other. The interpenetrating polymer network is generated from the independently cross-linkable monomers. The independently cross-linkable monomers are mixed and then subsequently are polymerized and cross-linked simultaneously or sequentially, but in the same phase so that these monomers become physically intertwined, to create this polymer network. An interpenetrating polymer network is distinguishable from a polymer blend, which is formed by physically mixing two (or more) polymers together. The polymers in a polymer blend are not intertwined because polymerization occurs prior to mixing the two polymers together.

The term "pitch," as used herein, refers to the spacing of the features. In one example, the pitch refers to the spacing from the center of one feature to the center of an adjacent or nearest neighboring feature. This pitch may be referred to as center-to-center spacing. In another example, the pitch refers to the spacing from the edge of one feature to the edge of an adjacent or nearest neighboring feature. This pitch may be referred to as edge-to-edge spacing.

As used herein, the term "primer" is defined as a single stranded nucleic acid sequence (e.g., single strand DNA). Some primers, which may be referred to as amplification primers, serve as a starting point for template amplification and cluster generation. Other primers, which may be referred to as sequencing primers, serve as a starting point for DNA synthesis. The 5' terminus of the primer may be modified to allow a coupling reaction with a functional group of a polymer coating. The primer length can be any number of bases long and can include a variety of non-natural nucleotides. In an example, the sequencing primer is a short strand, ranging from 10 to 60 bases, or from 20 to 40 bases.

Resin Mixture and Interpenetrating Polymer Network

As shown schematically in FIG. 1, examples of the interpenetrating polymer network 10 include two or more individual, but intertwined, polymer networks 12 and 14. The polymer networks 12, 14, and thus the interpenetrating polymer network 10, may be formed when a resin mixture of at least two different types of monomers is cured. In the examples disclosed herein, the curing mechanism of one type of monomer is orthogonal to the curing mechanism of the other type of monomer, and thus these components may be mixed without deleteriously affecting the curing efficiency. The orthogonal curing mechanisms are different and do not interfere with each other.

One of the polymer networks 12 may be generated through the cationic polymerization of a cationically polymerizable monomer. Epoxide-containing monomers are examples of cationically polymerizable monomers. In the examples disclosed herein, the epoxide-containing monomers are multi-functional epoxy monomers selected from the group consisting of:

i) 2,4,6,8-tetramethyl-2,4,6,8-tetrakis(propyl glycidyl ether) cyclotetrasiloxane:

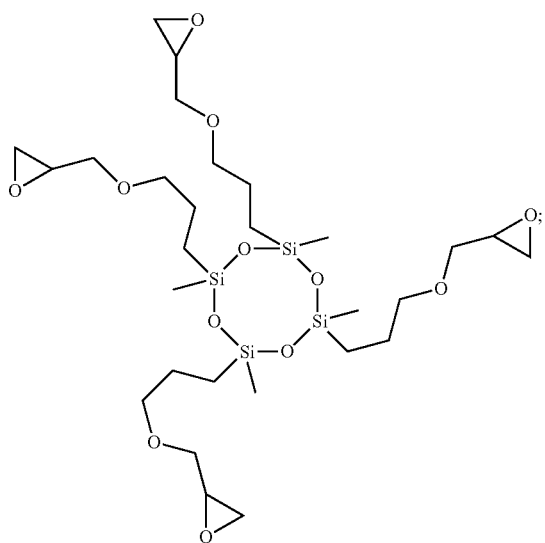 [SMILES: C[Si]1(CCCOCC2CO2)O[Si](C)(CCCOCC2CO2)O[Si](C)(CCCOCC2CO2)O[Si](C)(CCCOCC2CO2)O1]

ii) Tetrakis(epoxycyclohexyl ethyl)tetramethyl cyclotetrasiloxane:

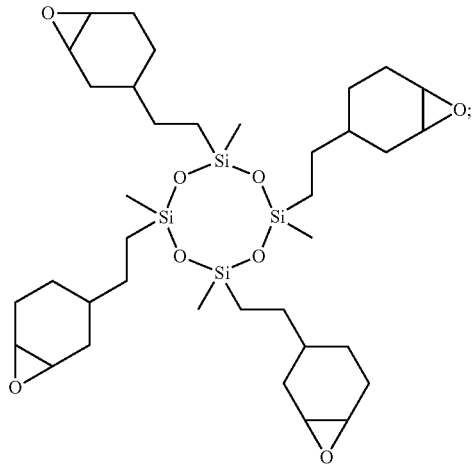 [SMILES: C[Si]1(CCC2CCC3OC3C2)O[Si](C)(CCC2CCC3OC3C2)O[Si](C)(CCC2CCC3OC3C2)O[Si](C)(CCC2CCC3OC3C2)O1]

iii) Poly(dimethylsiloxane), diglycidyl ether terminated:

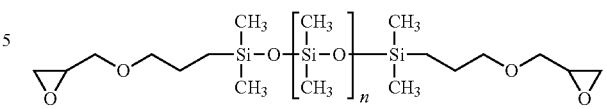

wherein $4<n<8$;

iv) Poly(propylene glycol) diglycidyl ether:

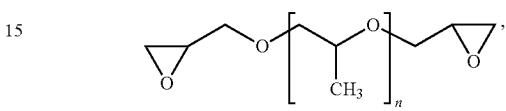

wherein $5<n<10$;

v) 3,4-Epoxycyclohexylmethyl 3,4-epoxycyclohexanecarboxylate:

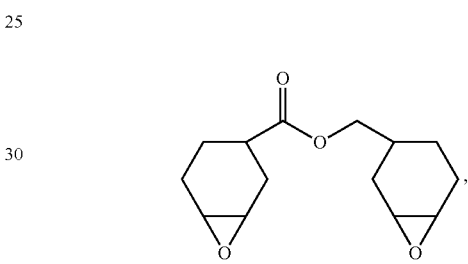

(which may be used for increased hardness);

vi) Bisphenol A diglycidyl ether, brominated:

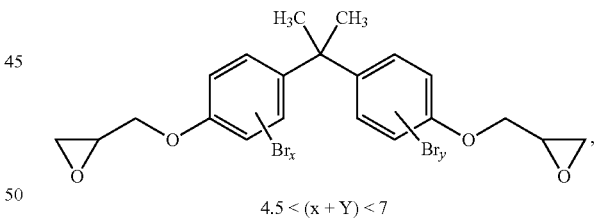

$4.5 < (x + Y) < 7$ (which may be used for higher refractive index);

vii) Poly(Bisphenol A-co-epichlorohydrin), glycidyl endcapped

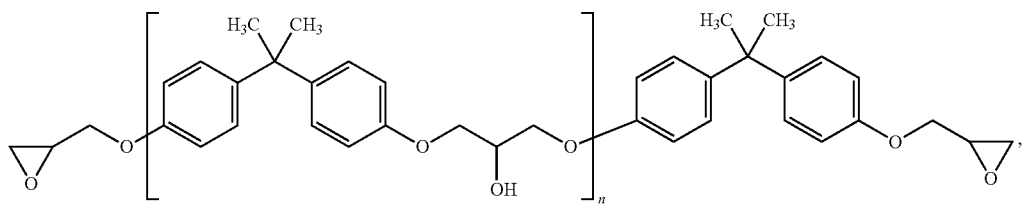

wherein 0<n<2;
viii) Bisphenol A propoxylate diglycidyl ether:

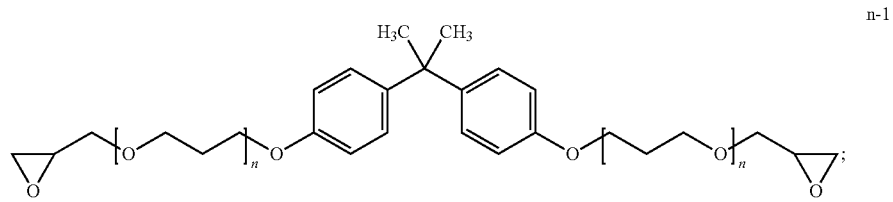

ix) Monophenyl functional tris(epoxy terminated polydimethylsiloxane):

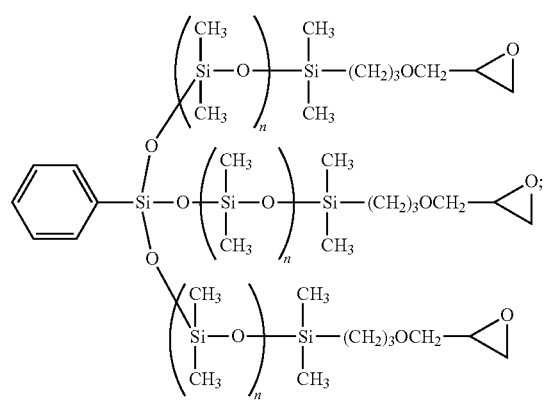

x) Trimethylolpropane triglycidyl ether:

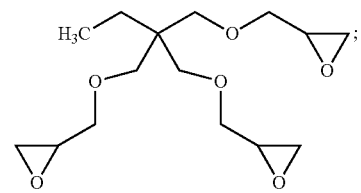 [SMILES: CCC(COCC1CO1)(COCC1CO1)COCC1CO1]

xi) 2,2'-(2,2,3,3,4,4,5,5-Octafluorohexane-1,6-diyl)bis(oxirane):

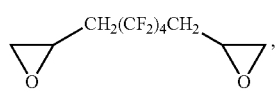

(which may be used for lower refractive index);
xii) 1,3-Bis(3-glycidoxypropyl)tetramethyldisiloxane:

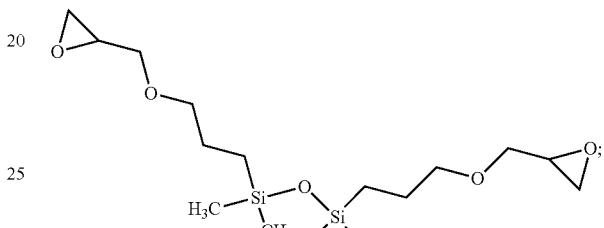

xiii) 1,3 Bis[2(3,4 epoxycyclohex-1-yl)ethyl]tetra-methyldisiloxane:

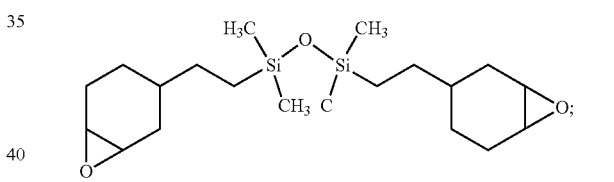

xiv) Glycidyl polyoctahedral silsesquioxane:

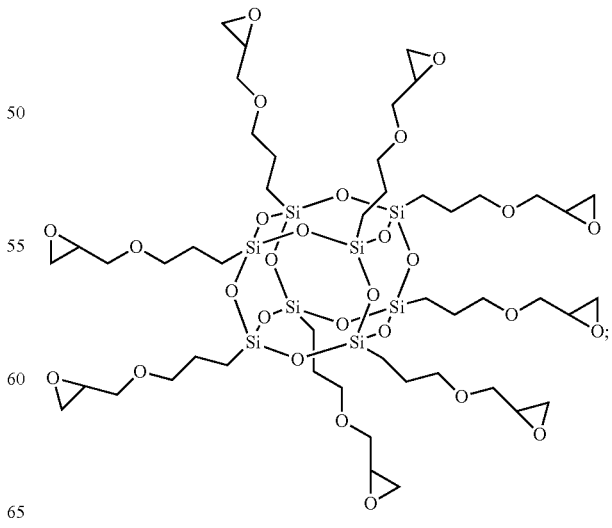

xv) Epoxycyclohexyl polyoctahedral silsesquioxane:

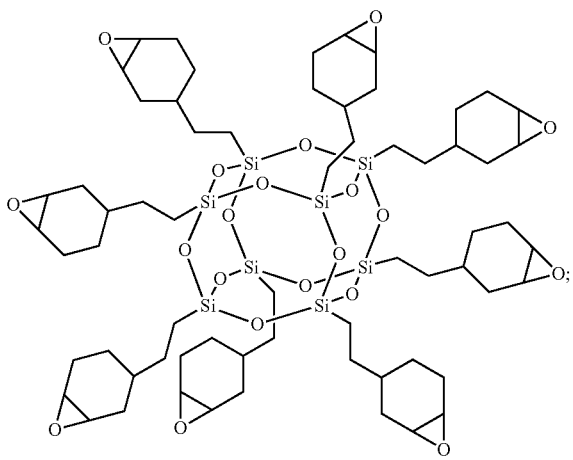

xvi) Tris(4-hydroxyphenyl)methane triglycidyl ether

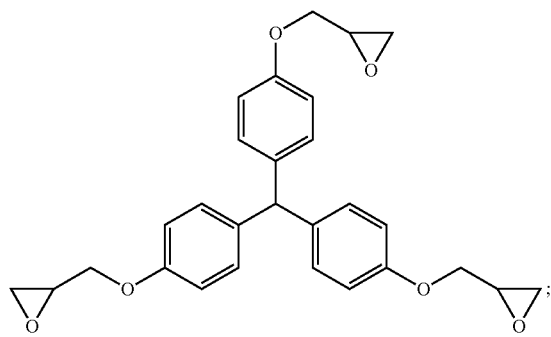 [SMILES: c1cc(C(c2ccc(OCC3CO3)cc2)c2ccc(OCC3CO3)cc2)ccc1OCC1CO1]

xvii) 4,4'-Methylenebis(N,N-diglycidylaniline)

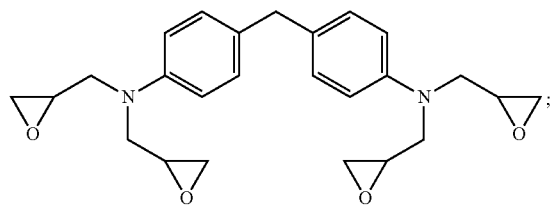 [SMILES: c1cc(N(CC2CO2)CC2CO2)ccc1Cc1ccc(N(CC2CO2)CC2CO2)cc1]

and
xviii) any combination of i) through xvii).

While several examples have been provided, it is to be understood that these examples are non-limiting, and that any other epoxide-containing monomers that are able to cross-link may be used. For example, any polyhedral oligomeric silsesquioxane (POSS) core that is functionalized with epoxy groups may be used. As used herein, the term "polyhedral oligomeric silsesquioxane" (POSS) refers to a chemical composition that is a hybrid intermediate $(RSiO_{1.5})$ between that of silica $(SiO_2)$ and silicone $(R_2SiO)$. An example of POSS can be that described in Kehagias et al., Microelectronic Engineering 86 (2009), pp. 776-778, which is incorporated by reference in its entirety. The composition is an organosilicon compound with the chemical formula $[RSiO_{3/2}]_n$, where the R groups can be the same or different.

In still other examples, a mono-functional epoxy monomer can be used along with the multi-functional epoxy monomers as a co-monomer to help tune the overall resin properties.

Examples of such mono-functional epoxy monomers include to the following molecules:

i) Glycidyl 2,2,3,3-tetrafluoropropyl ether (helps reducing resin refractive index):

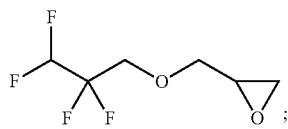 [SMILES: FC(F)C(F)(F)COCC1CO1]

ii) Glycidyl 2,2,3,3,4,4,5,5-octafluoropentyl ether (helps reducing resin refractive index):

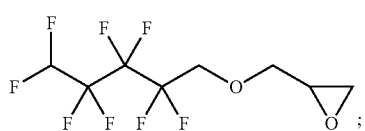 [SMILES: FC(F)C(F)(F)C(F)(F)C(F)(F)COCC1CO1]

iii) (2,2,3,3,4,4,5,5,6,6,7,7,8,8,9,9,9-Heptadecafluorononyl) oxirane (helps reducing resin refractive index):

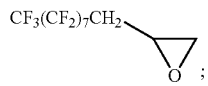

or
iv) any combination of i) through iii).

While several examples have been provided, it is to be understood that these examples are non-limiting, and that any other mono-functional epoxy monomers may be used.

The other of the polymer networks 14 is generated through the free radical polymerization of a free radical polymerizable monomer. Free radical polymerization kinetics are generally much faster than, e.g., the cationically initiated epoxy ring opening polymerization. (Meth)acryloyl-containing monomers are examples of free radical polymerizable monomers. In the examples disclosed herein, the (meth)acryloyl-containing monomers are multi-functional (meth)acryloyl monomers selected from the group consisting of:

i) 2,2,3,3,4,4,5,5-octafluoro-1,6-hexanediol diacrylate:

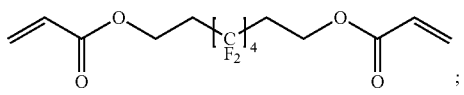

ii) Pentaerythritol tetraacrylate:

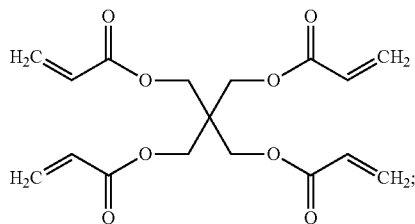 [SMILES: C=CC(=O)OCC(COC(=O)C=C)(COC(=O)C=C)COC(=O)C=C]

iii) Pentaerythritol triacrylate:

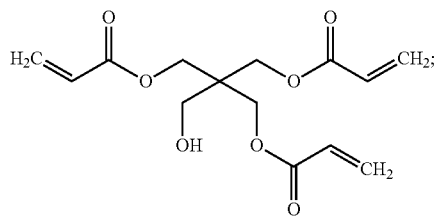 [SMILES: C=CC(=O)OCC(CO)(COC(=O)C=C)COC(=O)C=C]

iv) Glycerol 1,3-diglycerolate diacrylate:

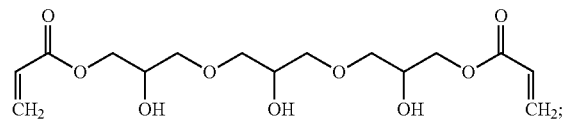 [SMILES: C=CC(=O)OCC(O)COCC(O)COCC(O)COC(=O)C=C]

v) Poly(ethylene glycol) dimethacrylate:

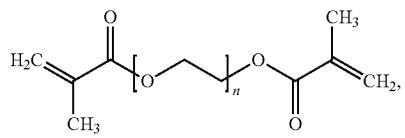

wherein 8<n<10;

vi) Glycerol dimethacrylate, mixture of isomers:

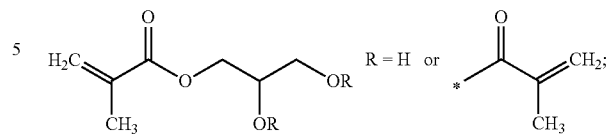

vii) 3-(Acryloyloxy)-2-hydroxypropyl methacrylate:

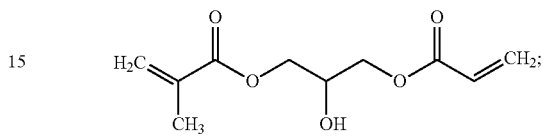

viii) Ethylene glycol dimethacrylate;

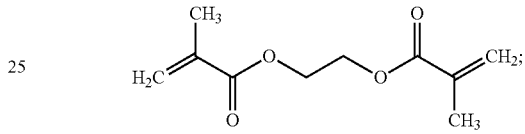

ix) Bis(2-methacryloyl)oxyethyl disulfide

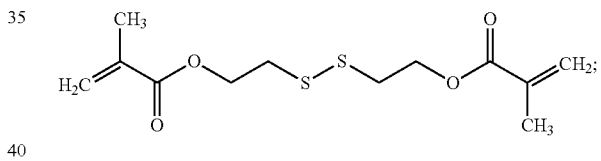

x) Tricyclodecane dimethanol diacrylate

xi) Bisphenol A glycerolate (1 glycerol/phenol) diacrylate

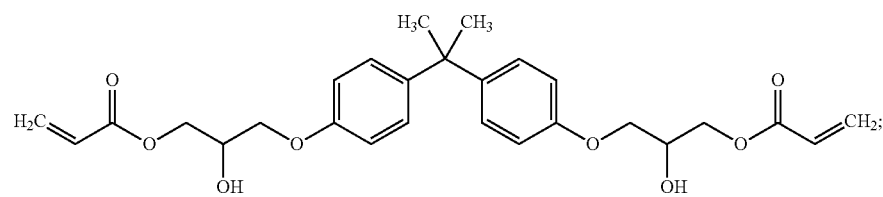 [SMILES: C=CC(=O)OCC(O)COc1ccc(C(C)(C)c2ccc(OCC(O)COC(=O)C=C)cc2)cc1]

xii) Bisphenol A dimethacrylate:

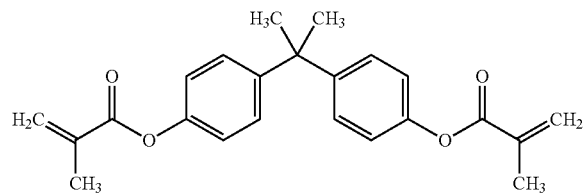 [SMILES: C=C(C)C(=O)Oc1ccc(C(C)(C)c2ccc(OC(=O)C(=C)C)cc2)cc1]

xiii) Methacryloxypropyl terminated polydimethylsiloxane:

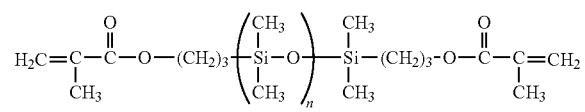

wherein n is selected to render the monomer with a molecular weight of about 420 g/mol, 950 g/mol, 4,000 g/mol, 10,000 g/mol, or 25,000 g/mol; and xiv) Zirconium bromonorbornanelactone carboxylate triacrylate:

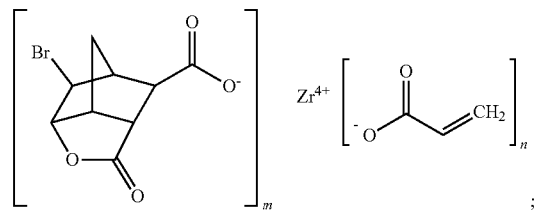

wherein m ranges from 0 to 4, n ranges from 0 to 4, and m+n=4;

xv) Zirconium acrylate:

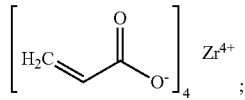

xvi) Hafnium carboxyethyl acrylate:

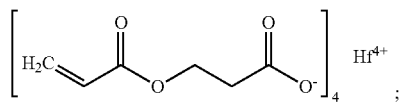

xvii) Acrylo polyoctahedral silsesquioxane:

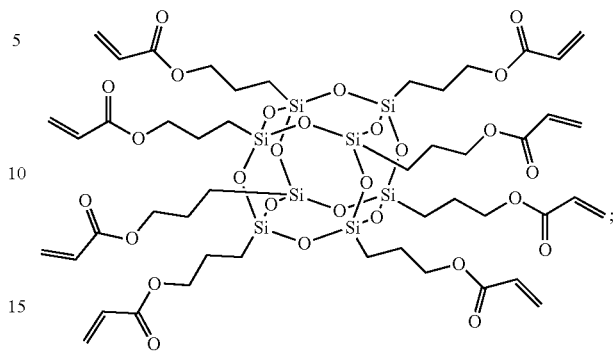

xviii) Methacryl polyoctahedral silsesquioxane:

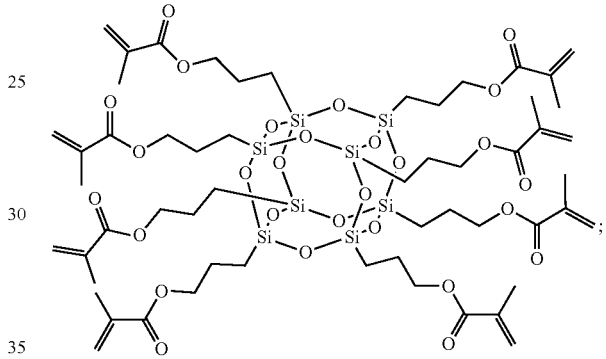

xix) 2,4,6,8-Tetramethyl-2,4,6,8-tetrakis(3-acryloyloxypropyl) cyclotetrasiloxane:

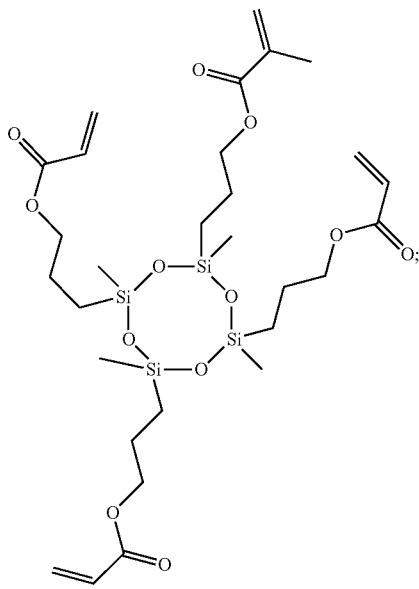 [SMILES: C=CC(=O)OCCC[Si]1(C)O[Si](C)(CCCOC(=O)C=C)O[Si](C)(CCCOC(=O)C(=C)C)O[Si](C)(CCCOC(=O)C=C)O1]

and xx) any combination of i) through xix).

While several examples have been provided, it is to be understood that these examples are non-limiting, and that any other (meth)acryloyl-containing monomers that are able to cross-link may be used.

In still other examples, a mono-functional (meth)acryloyl monomer can be used along with the multi-functional (meth)acryloyl monomers as a co-monomer to help tune the overall resin properties. Examples of such mono-functional (meth)acryloyl monomer include the following molecules:

i) Pentabromobenzyl acrylate:

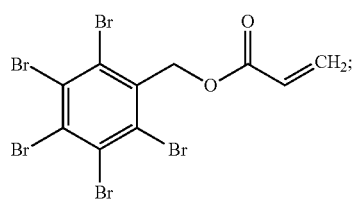 [SMILES: C=CC(=O)OCc1c(Br)c(Br)c(Br)c(Br)c1Br]

ii) 2,2,3,3,4,4,5,5,6,6,7,7-Dodecafluoroheptyl acrylate:

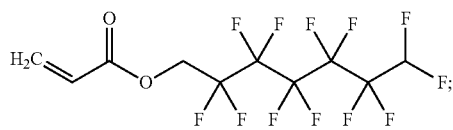 [SMILES: C=CC(=O)OCC(F)(F)C(F)(F)C(F)(F)C(F)(F)C(F)(F)C(F)F]

iii) 2-[(1',1',1'-Trifluoro-2'-(trifluoromethyl)-2'-hydroxy)propyl]-3-norbornyl methacrylate:

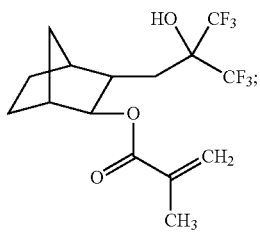 [SMILES: C=C(C)C(=O)OC1C2CCC(C2)C1CC(O)(C(F)(F)F)C(F)(F)F]

iv) 2,2,2-Trifluoroethyl methacrylate:

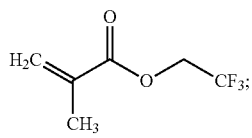

v) 2,2,3,3-Tetrafluoropropyl methacrylate:

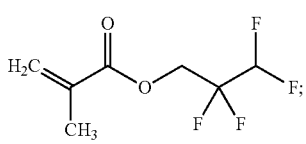

vi) 3-(Acrylamido)phenylboronic acid

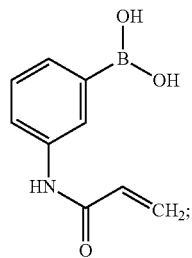 [SMILES: C=CC(=O)Nc1cccc(B(O)O)c1]

vii) Hexafluoro-iso-propyl methacrylate:

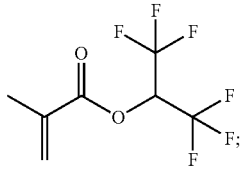

viii) Pentafluorophenyl acrylate:

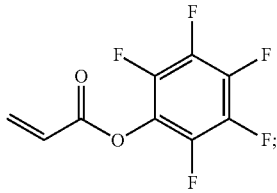 [SMILES: C=CC(=O)Oc1c(F)c(F)c(F)c(F)c1F]

ix) Pentafluorophenyl methacrylate:

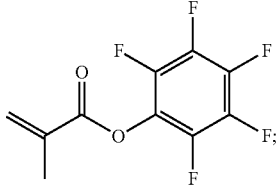 [SMILES: C=C(C)C(=O)Oc1c(F)c(F)c(F)c(F)c1F]

x) 1,1,1,3,3,3-Hexafluoroisopropyl acrylate:

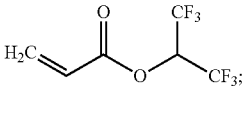

xi) 1,1,1,3,3,3-Hexafluoroisopropyl methacrylate:

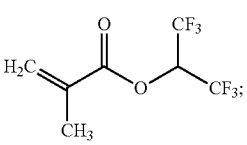

xii) Poly(dimethylsiloxane), monomethacrylate terminated:

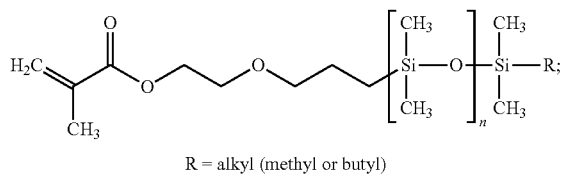

R = alkyl (methyl or butyl)

wherein n is selected to target any molecular weight between 250 g/mol, and 50,000 g/mol;

xiii) Tert-Butyl acrylate:

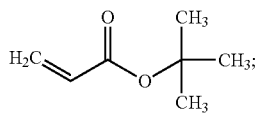

xiv) Tert-Butyl methacrylate:

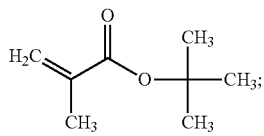

xv) 2-Carboxyethyl acrylate oligomers:

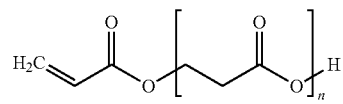

wherein n ranges from 0 to 3; and
xvi) any combination of i) through xv).

In one example, the cationically polymerizable monomer is a multi-functional epoxy monomer and the free radical polymerizable monomer is a multi-functional (meth)acryloyl monomer. Multi-functional monomers include more cites for polymerization and cross-linking. In another, more specific example, the cationically polymerizable monomer is an epoxy siloxane monomer and the free radical polymerizable monomer is a (meth)acryloyl monomer.

Each of the discussed curing mechanisms (cationic and free radical) may be initiated by exposure to ultraviolet (UV) light. In some examples, alternate UV-triggered curing mechanisms may be used, e.g., thiol-ene chemistry may be used in place of the radical initiated monomers disclosed herein because this type of chemistry also involves free radical polymerization. Some example vinyl-based molecules that engage in thiol-ene chemistry include:

i) Vinyl terminated polydimethylsiloxane:

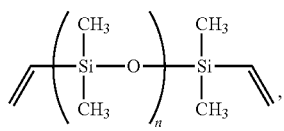

wherein n is selected to render the monomer with a molecular weight of about 800 g/mol, 9,400 g/mol, 28,000 g/mol, 49,500 g/mol, 117,000 g/mol, or 155,000 g/mol;

ii) Bis(divinyl)terminated polydimethylsiloxane:

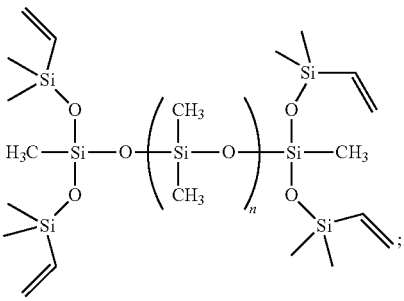

iii) Pentaerythritol tetrakis(3-mercaptopropionate):

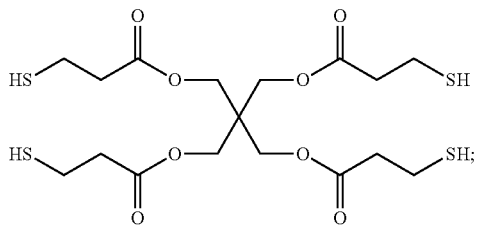 [SMILES: O=C(CCS)OCC(COC(=O)CCS)(COC(=O)CCS)COC(=O)CCS]

iv) 2,2'-Thiodiethanethiol:

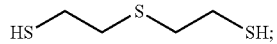

v) 1,5-Pentanedithiol:

$HSCH_2(CH_2)_3CHSH$;

vi) Octavinyl polyoctahedral silsesquioxane:

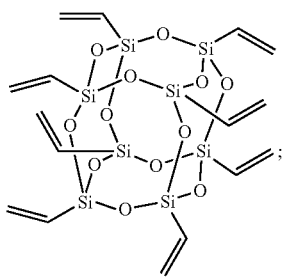

and
vii) any combination of i) through vi).

Referring now to FIG. 2, an example of a method is depicted at reference numeral 100. As shown, the method 100 includes mixing the cationically polymerizable monomer (this can be a multi-functional monomer on its own or a mix of at least one multi-functional monomer and one or multiple mono- or multi-functional monomer(s)) and the free radical polymerizable monomer (this can be a multi-functional monomer on its own or a mix of at least one multifunctional monomer and one or multiple mono- or multi-functional monomer(s)) to form a resin mixture, wherein the resin mixture is a precursor to an interpenetrating polymer network that is to be incorporated into a flow cell (reference numeral 102); adjusting a weight ratio of the cationically polymerizable monomer and the free radical polymerizable monomer using at least a property to be imparted to the resin mixture or the interpenetrating polymer network, the property being selected from the group consisting of refractive index of the interpenetrating polymer network, absorption of the interpenetrating polymer network, hardness of the interpenetrating polymer network, thickness of the interpenetrating polymer network, hydrophilic/hydrophobic balance of the interpenetrating polymer network, viscosity of the resin mixture, surface chemistry compatibility of the resin mixture with a working stamp, surface chemistry compatibility of the interpenetrating polymer network, shrinkage of the interpenetrating polymer network, and combinations thereof (reference numeral 104); and patterning the resin mixture to form the interpenetrating polymer network (reference numeral 106).

Any example of the cationically polymerizable monomer and the free radical polymerizable monomer disclosed herein may be used.

In general, the weight ratio of the cationically polymerizable monomer to the free radical polymerizable monomer resin mixture ranges from about 10:90 (1:9) to about 90:10 (9:1). In the examples disclosed herein, the weight ratio of these monomers may be adjusted in order to obtain a predetermined property of the resin mixture and/or to obtain a predetermined of the resulting interpenetrating polymer network 10. The predetermined property of the resin mixture may be viscosity and/or wettability with a working stamp and/or a substrate (e.g., a substrate of the flow cell). The predetermined property of the resulting interpenetrating polymer network 10 may be the hydrophilic/hydrophobic balance, the thickness, the refractive index, absorption, the surface properties (e.g., stickiness, chemical resistance, etc.), the shrinkage, and/or the hardness. The autofluorescence of the interpenetrating polymer network 10 may also be adjusted or eliminated by selecting a particular initiator for the resin mixture.

The effect that the weight ratio has on a particular property will depend, in part, upon the monomers, and the respective properties of the monomers, that are used.

Figure 5A:
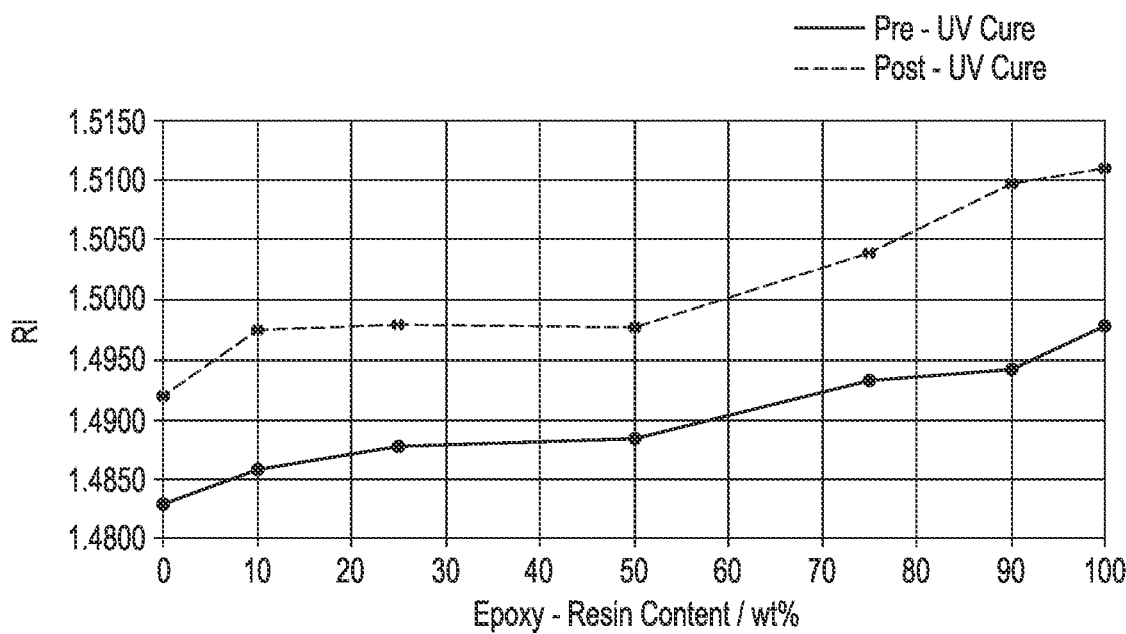
FIG. 5A is a graph depicting the refractive index of a resin mixture and a cured resin versus the epoxy monomer content in the resin mixture.
Figure 5B:
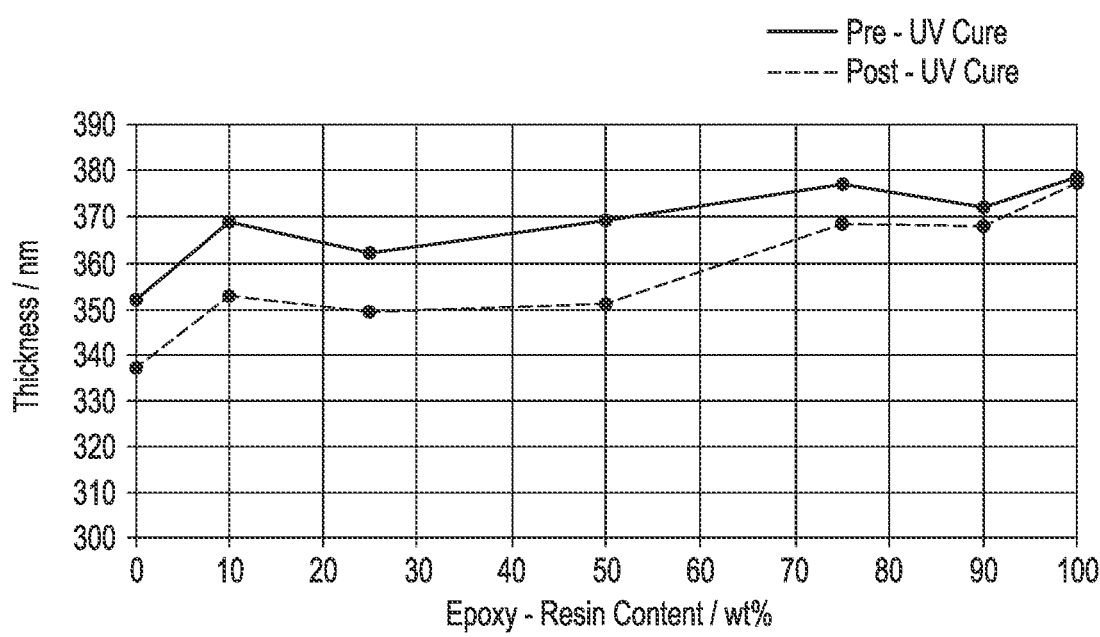
FIG. 5B is a graph depicting the thickness of a deposited resin mixture and a cured resin versus the epoxy monomer content in the resin mixture.

FIG. 5A and FIG. 5B (both of which are discussed in detail in the Example section) illustrates the effect of the weight ratio of a mixture epoxy-based monomers:

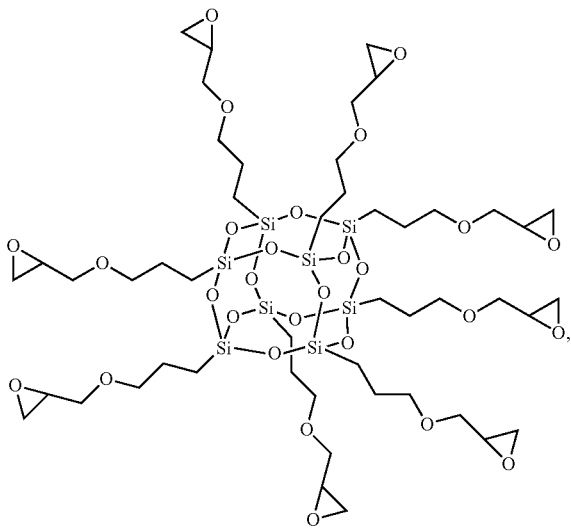

-continued
and

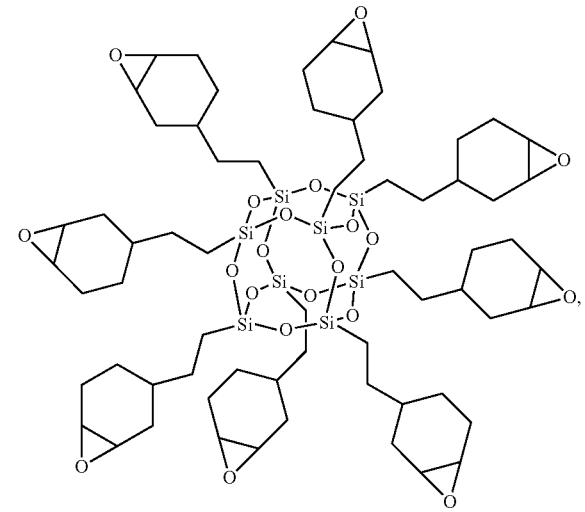

and one acryloyl-based monomer:

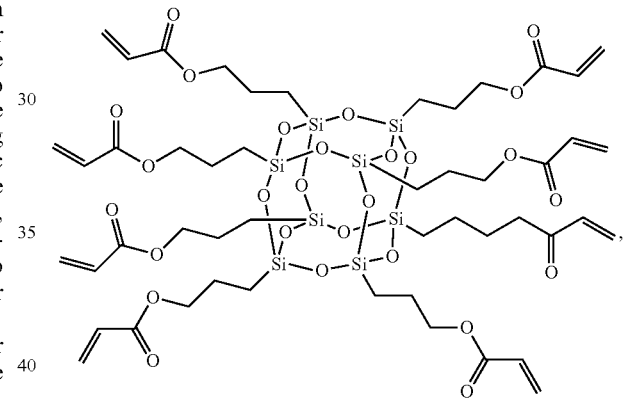

on the refractive index of both the resin mixture and the resulting interpenetrating polymer network 10 (FIG. 5A) and on the thickness of a layer of the resin mixture and the thickness of the resulting interpenetrating polymer network 10 (FIG. 5B). With this particular combination of monomers, the refractive index of the resin mixture and the resulting interpenetrating polymer network 10 may be maintained at a desirably low level when the ratio of the cationically polymerizable monomer (epoxy) to the free radical polymerizable monomer (acrylol) ranges from about 10:90 (1:9) to about 50:50 (1:1). With this particular combination of monomers, the thickness of the resin mixture and the resulting interpenetrating polymer network 10 is generally reduced as the epoxy content is lowered.

To achieve desirable surface properties (e.g., stickiness, chemical resistance, etc.) for the interpenetrating polymer network 10, each of monomers selected may have these same or similar properties so that the properties are imparted to the network 10. In this example, the weight ratio may be within the 10:90 (1:9) to about 90:10 (9:1).

For shrinkage, (meth)acrylo-based monomers do shrink more significantly than epoxy-based materials. As a result, to limit shrinkage of the final interpenetrating polymer network 10, a higher amount of the epoxy material may be used.

For hardness, some epoxy-based monomers are harder than some (meth)acrylo-based monomers. The weight ratio will thus depend upon the hardness of the individual monomers and the desired hardness of the final interpenetrating polymer network 10.

Multiple properties may also be targeted, which can affect the weight ratio. For example, it may be desirable to target a low refractive index for the interpenetrating polymer network 10 and good wettability with the working stamp. For low refractive index, a fluorinated monomer may be selected, but this could deleteriously affect the wettability of the resin mixture with the working stamp. In this example, the second monomer and its amount may be selected to recover some of the compatibility. The second monomer may be present in an amount of at least 33 wt %.

The weight ratio of the cationically polymerizable monomer and the free radical polymerizable monomer may also be adjusted to render the resin mixture imprintable. An imprintable resin is one that can conform to the features of an applied working stamp; that, upon curing, can lock in the configuration of the feature of the applied working stamp; and that can cleanly release the working stamp after curing. As such, reference numeral 104 of the method 100 may include adjusting the weight ratio of the cationically polymerizable monomer and the free radical polymerizable monomer to render the resin mixture imprintable by a working stamp. To render the resin mixture imprintable by a working stamp, the material of the working stamp may be taken into consideration when adjusting the weight ratio of the monomers. For example, the material of the working stamp may affect the wettability of the resin mixture to the working stamp, as well as the releasability of the resulting interpenetrating polymer network 10.

As such, the monomers and the associated weight ratio may be selected to be compatible with the working stamp, or the working stamp may be selected to be compatible with the monomers and the associated weight ratio. In the latter example, the weight ratio may be adjusted to achieve one or more target properties, and then the working stamp chemistry may be selected to suitably imprint the resin mixture. Moreover, imprintability may also be improved by other factors, such as increased UV exposure (for a resin greater extent of cure) and/or addition of a leveling agent to the resin mixture.

In the following examples, the working stamp material is a silicon-based material, such as polymerized silicon acrylate or methacrylate. In one example of a resin mixture that is imprintable by these working stamps, the multi-functional epoxy monomer is poly(propylene glycol) diglycidyl ether, the multi-functional acryloyl monomer is 2,2,3,3,4,4,5,5-octafluoro-1,6-hexanediol diacrylate, and the predetermined weight ratio is about 50:50 (1:1). In another example of a resin mixture that is imprintable by these working stamps, the multi-functional epoxy monomer is poly(propylene glycol) diglycidyl ether, the multi-functional acryloyl monomer is glycerol 1,3-diglycerolate diacrylate; and the predetermined weight ratio ranges from about 25:75 (1:3) to about 75:25 (3:1).

For some (meth)acryloyl monomers, the maximum weight ratio is 1:1, and thus other examples include more of the epoxy monomer and less of the (meth)acryloyl monomer. This may be due to the epoxy monomer being able to wet the working stamp material better than the (meth)acryloyl monomers.

In addition to the cationically polymerizable monomer and the free radical polymerizable monomer (which are present in the desired weight ratio), examples of the resin mixture disclosed herein may also include a cationic photoinitiator and a free radical photoinitiator. The respective photoinitiators may be used in an amount ranging from about 0.25 wt % to about 10 wt % with respect to the monomer it initiates. In other examples, each photoinitiator is present in the mixture in an amount ranging from about 0.5 wt % to about 9.5 wt %, e.g., from about 1 wt % to about 5 wt %, with respect to the monomer it initiates with respect to the monomer it initiates.

Cationic photoinitiators can be used to initiate curing of the cationically polymerizable monomer(s). The cationic photoinitiator may be a system including a photo-acid generator (which is the cationic compound) and a sensitizer (which helps the formation of the cationic compound). These two compounds can be used in a 1:1 weight ratio, or at some other suitable weight ratio. Each of these two compounds can also be present in the amounts provided herein for the photoinitiator. Suitable cationic compounds (photo-acid generators) include any of a variety of known useful materials such as onium salts, certain organometallic complexes, and the like, and mixtures thereof. Some specific examples of suitable cationic photoinitiators include N-hydroxynaphthalimide triflate; triarylsulfonium hexafluorophosphate salts, mixed; triarylsulfonium hexafluoroantimonate salts, mixed; 1-naphthyl diphenylsulfonium triflate; 4-phenylthiophenyl)diphenylsulfonium triflate; bis-(4-methylphenyl)iodonium hexafluorophosphate; bis(4-tert-butylphenyl)iodonium hexafluorophosphate; (2-methylphenyl)(2,4,6-trimethylphenyl)iodonium triflate; bis(2,4,6-trimethylphenyl)iodonium triflate; bis-(4-dedecylphenyl) iodonium hexafluoroantimonate salt; and combinations thereof.

Free radical photoinitiators can be used to initiate curing of the free radical polymerizable monomer(s). Suitable free radical photoinitiators include benzoin ethers (for example, benzoin methyl ether and benzoin isopropyl ether), substituted benzoin ethers (for example, anisoin methyl ether), substituted acetophenones (for example, 2,2-diethoxyacetophenone and 2,2-dimethoxy-2-phenylacetophenone), substituted alpha-ketols (for example, 2-methyl-2-hydroxypropiophenone), aromatic phosphine oxides (for example, diphenyl(2,4,6-trimethylbenzoyl)phosphine oxide; a blend of diphenyl(2,4,6-trimethylbenzoyl)phosphine oxide and 2-hydroxy-2-methylpropiophenone; phenylbis(2,4,6-trimethylbenzoyl)phosphine oxide; and ethyl(2,4,6-trimethylbenzoyl)phenylphosphinate), aromatic sulfonyl chlorides (for example, 2-naphthalene-sulfonyl chloride), photoactive oximes (for example, 1-phenyl-1,2-propanedione-2(O-ethoxycarbonyl)oxime), and the like, and mixtures thereof.

The resin mixture may also include a solvent so that it can be deposited on a substrate for imprinting and curing. The resin mixture may be diluted in the solvent to achieve a desired viscosity for the deposition technique that is to be used and/or to achieve a targeted and at least substantially uniform resin layer thickness. Examples of suitable solvents include, for example, propylene glycol monomethyl ether acetate (PGMEA), toluene, dimethyl sulfoxide (DMSO), tetrahydrofuran (THF), etc. In an example, the total concentration of the monomers in the solvent ranges from about 15 weight % (wt %) to about 56 wt % (where the monomers are present in the desired weight ratio), and the total concentration of the photoinitiators in the solvent ranges from about 1 wt % to about 10 wt %, although it is believed that the upper limits may be higher depending upon the respective solubility of the monomers and photoinitiators in the solvent that is selected.

Figure 3B:
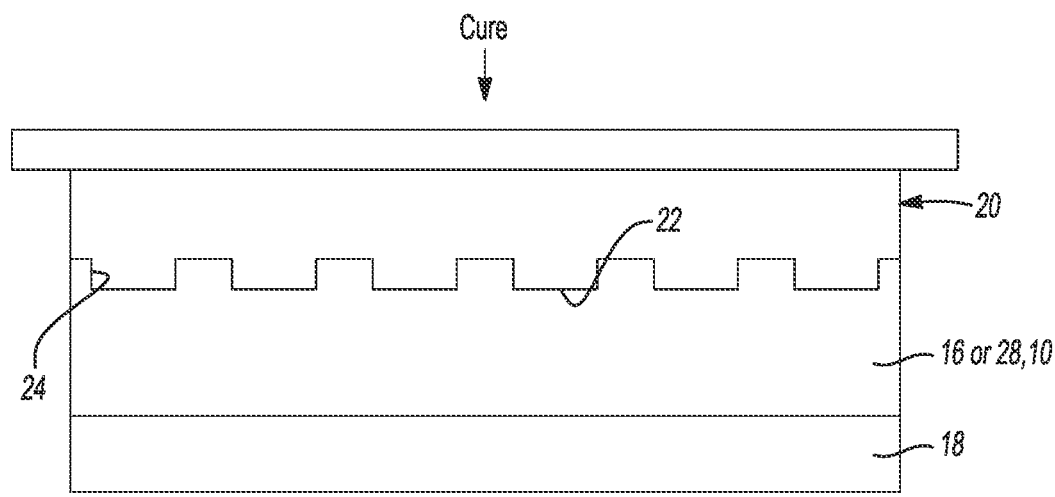
Figure 3C:
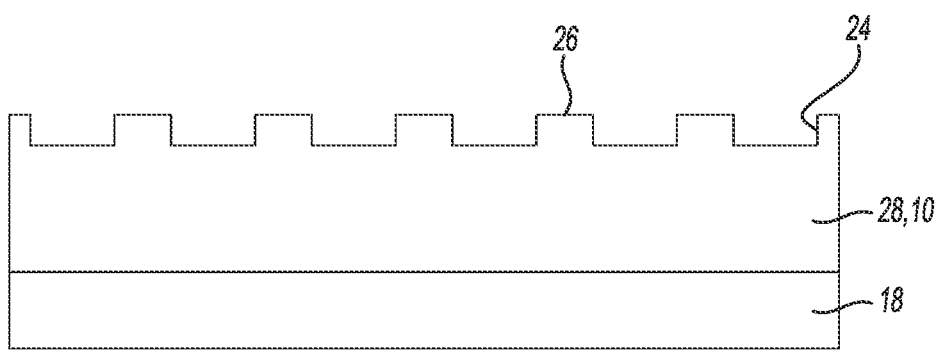

Referring now to FIG. 3A through FIG. 3C, an example of a method for making a patterned interpenetrating polymer network 10 is depicted. The method includes applying a resin mixture on a substrate, the resin mixture including two independently cross-linkable monomers present in the resin mixture 16 at a predetermined weight ratio, a first of the two independently cross-linkable monomers being the cationically polymerizable monomer and a second of the two independently cross-linkable monomers being a free radical polymerizable monomer; imprinting the resin mixture 16 with a working stamp 20 having a plurality of nano-features 22; and curing the resin mixture 16 while the working stamp 20 is in place, thereby forming an interpenetrating polymer network (10) imprinted with flow cell nano-depressions.

FIG. 3A depicts the application of the resin mixture 16 on the substrate 18. Any example of the resin mixture 16 described herein may be used. The substrate 18 used may depend upon the type of flow cell that is to be formed.

In some examples, the substrates may be epoxy siloxane, glass and modified or functionalized glass, plastics (including acrylics, polystyrene and copolymers of styrene and other materials, polypropylene, polyethylene, polybutylene, polyurethanes, polytetrafluoroethylene (such as TEFLON® from Chemours), cyclic olefins/cyclo-olefin polymers (COP) (such as ZEONOR® from Zeon), polyimides, etc.), nylon, ceramics/ceramic oxides, silica, fused silica, or silica-based materials, aluminum silicate, silicon and modified silicon (e.g., boron doped p+ silicon), silicon nitride ($Si_3N_4$), silicon oxide ($SiO_2$), tantalum pentoxide ($Ta_2O_5$) or other tantalum oxide(s) ($TaO_x$), hafnium oxide ($HaO_2$), carbon, metals, inorganic glasses, or the like.

The substrate may also be a multi-layered structure. Some examples of the multi-layered structure include glass or silicon, with a coating layer of tantalum oxide or another metal oxide at the surface. Other examples of the multi-layered structure include an underlying support (e.g., glass or silicon) having a patterned resin thereon. Still other examples of the multi-layered substrate may include a silicon-on-insulator (SOI) substrate. Another example of a multi-layer substrate includes a planar waveguide. As one example, a glass base may support a grating layer (a laser coupling grating) and a planar waveguide layer.

It is desirable for the grating layer to have a refractive index within the range of from about 1.35 to about 1.55, and a resin with a suitable refractive index may be used to generate the grating layer. In one example, a fluorinated monomer may be included in the resin to achieve a refractive index within the range of from about 1.35 to about 1.4. In another example, a slightly fluorinated or siloxane-based monomer may be included in the resin to achieve a refractive index within the range of from about 1.4 to about 1.45. In still another, the content of the siloxane-based monomer in the resin may be lowered to achieve a refractive index within the range of from about 1.45 to about 1.5.

It is desirable for the planar waveguide layer to have a refractive index greater than the refractive index of the patterned interpenetrating polymer network 10. In some examples, it is desirable for the planar waveguide to have a refractive index within the range of from about 1.6 to about 2.6, and a resin with a suitable refractive index may be used to generate the planar waveguide layer. Highly transparent polymers having a refractive index ranging from about 1.6 to about 1.65 may be used for the planar waveguide, and may be deposited using nano-imprint lithography. Highly transparent monomers with a high polarizability and/or bromide content having a refractive index ranging from about 1.65 to about 1.8 may be used for the planar waveguide, and may be deposited using nano-imprint lithography. Highly transparent metal oxides having a refractive index greater than 1.8 may be used for the planar waveguide, and may be deposited using sputtering. As example metal oxides, the following may be used: zinc monoxide (ZnO) with a refractive index of about 2.00; tantalum pentoxide ($TaO_5$) with a refractive index of about 2.3; zirconium dioxide ($ZrO_2$) with a refractive index of about 2.14; or titanium dioxide ($TiO_2$) with a refractive index of about 2.64.

In any of the examples disclosed herein, the substrate may have a diameter ranging from about 2 mm to about 300 mm, or a rectangular sheet or panel having its largest dimension up to about 10 feet 3 meters). In an example, the substrate is a wafer having a diameter ranging from about 200 mm to about 300 mm. In another example, the substrate is a die having a width ranging from about 0.1 mm to about 10 mm. While example dimensions have been provided, it is to be understood that a substrate with any suitable dimensions may be used. For another example, a panel may be used that is a rectangular support, which has a greater surface area than a 300 mm round wafer.

The application of the resin mixture 16 onto the substrate 18 may be performed using any of the deposition techniques described herein. After the resin mixture 16 is deposited, it may be softbaked to remove excess solvent.

FIG. 3B depicts the imprinting of the resin mixture 16 with a working stamp 20 having a plurality of nano-features 22. The pattern of the nano-features 22 of the working stamp 20 is a negative replica of the desired features (e.g., nano-depressions 24 (see FIG. 3C) to be formed in the cured, patterned resin 28. The size and shape of the nano-features 22 will depend upon the desired size and shape for the nano-depressions 24.

The working stamp 20 is pressed into the resin mixture 16 to create an imprint on/in the resin mixture. The working stamp 20 is held in place during curing, as depicted in FIG. 3B.

Curing may be performed by exposure to actinic radiation, such as ultraviolet (UV) radiation using, e.g., metal halide light sources, mercury vapor light sources, UV emitting LED light sources, etc. Curing promotes cation and radical formation due to the presence of the respective photoinitiators, and these cations and radicals are used to respectively cure the epoxy and (meth)acryloyl portions of the resin mixture 16. As such, curing promotes separate polymerization and/or cross-linking of the monomers in the resin mixture 16.

Curing may include a single UV exposure stage, or may include multiple stages, including a softbake (e.g., to drive off solvent(s)) and then UV exposure. When included, the softbake may take place at a lower temperature, ranging from about 50° C. to about 150° C. for greater than 0 seconds to about 3 minutes, and may take place before the working stamp 20 is placed in the resin mixture 16. In an example, the softbake time ranges from about 30 seconds to about 2.5 minutes.

Some multi-stage curing processes may also include a hardbake. However, the curing mechanisms of the resin mixture 16 disclosed herein are so fast, that the resin mixture 16 may reach maximum curing without a hardbake. If performed, the working stamp 20 is released/detached before the hardbake, e.g., so that the working stamp 20 does not bond to the cured, patterned resin 28. If performed, the duration of the hardbake may last from about 5 seconds to about 10 minutes at a temperature ranging from about 60° C. to about 300° C. Hardbaking may be performed, for example, to remove residual solvent(s), to further polymerization of some of the resin mixture 16 material(s) (and thus enhance the extent of curing and reach acceptable layer hardness), and/or to aid in locking in the imprinted topography. Examples of devices that can be used for softbaking and/or hardbaking include a hot plate, oven, etc.

After curing, the working stamp 20 is released, as shown in FIG. 3C. Curing forms the cured, patterned resin 28. The chemical make-up of the cured, patterned resin 28 is the interpenetrating polymer network 10. The chemical make-up of the interpenetrating polymer network 10 will depend upon the composition of the resin mixture 16. In one example, the cured, patterned resin 28 of the interpenetrating polymer network 10 may have a weight ratio of an epoxy-based polymer to a (meth)acryloyl-based polymer ranges from 25:75 to about 75:25. In one example, the thickest portion of the thickness of the cured-pattern resin ranges from about 225 nm to about 600 nm.

As shown in FIG. 3C, the cured, patterned resin 28 includes the nano-depressions 24 defined therein, and interstitial regions 26 separating adjacent nano-depressions 24.

The nano-depressions 24 are the negative replica of the working stamp nano-features 22. Examples of the resin mixture disclosed herein can be formulated to be successfully imprinted with a working stamp having whose nano-features 22 will create the nano-depressions 24 disclosed herein.

Many different layouts of the nano-depressions 24 may be envisaged, including regular, repeating, and non-regular patterns. In an example, the nano-depressions 24 are disposed in a hexagonal grid for close packing and improved density. Other layouts may include, for example, rectilinear (i.e., rectangular) layouts (e.g., lines or trenches), triangular layouts, and so forth. In some examples, the layout or pattern can be an x-y format of nano-depressions 24 that are in rows and columns. In some other examples, the layout or pattern can be a repeating arrangement of nano-depressions 24 and/or interstitial regions 26. In still other examples, the layout or pattern can be a random arrangement of nano-depressions 24 and/or interstitial regions 26.

The layout or pattern may be characterized with respect to the density of the nano-depressions 24 (i.e., number of nano-depressions 24) in a defined area. For example, the nano-depressions 24 may be present at a density of approximately 2 million per mm$^2$. The density may be tuned to different densities including, for example, a density of about 100 per mm$^2$, about 1,000 per mm$^2$, about 0.1 million per mm$^2$, about 1 million per mm$^2$, about 2 million per mm$^2$, about 5 million per mm$^2$, about 10 million per mm$^2$, about 50 million per mm$^2$, or more or less. It is to be further understood that the density of nano-depressions 24 in the cured, patterned resin 28 can be between one of the lower values and one of the upper values selected from the ranges above. As examples, a high density array may be characterized as having nano-depressions 24 separated by less than about 100 nm, a medium density array may be characterized as having nano-depressions 24 separated by about 400 nm to about 1 µm, and a low density array may be characterized as having nano-depressions 24 separated by greater than about 1 µm. While example densities have been provided, it is to be understood that substrates with any suitable densities may be used.

The layout or pattern of the nano-depressions 24 may also or alternatively be characterized in terms of the average pitch. The pattern can be regular, such that the coefficient of variation around the average pitch is small, or the pattern can be non-regular in which case the coefficient of variation can be relatively large. In either case, the average pitch can be, for example, about 50 nm, about 0.1 µm, about 0.5 µm, about 1 µm, about 5 µm, about 10 µm, about 100 µm, or more or less. The average pitch for a particular pattern of nano-depressions 24 can be between one of the lower values and one of the upper values selected from the ranges above. In an example, the nano-depressions 24 have a pitch (center-to-center spacing) of about 1.5 µm. While example average pitch values have been provided, it is to be understood that other average pitch values may be used.

The size of each nano-depression 24 may be characterized by its volume, well opening area, depth, and/or diameter.

Figure 4A:
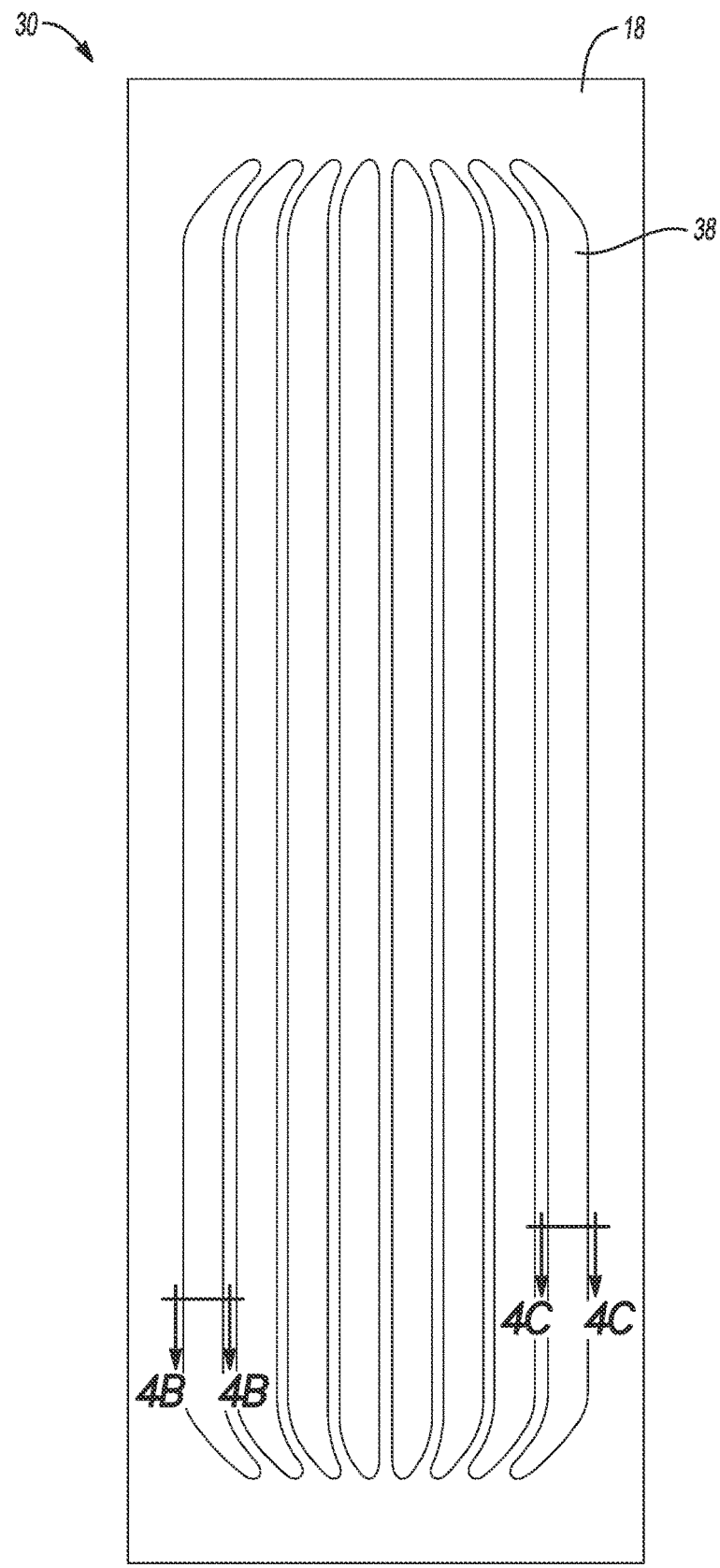
FIG. 4A is a top view of an example of a flow cell.

Each nano-depression 24 can have any volume that is capable of confining at least some fluid that is introduced into the flow cell (reference numeral 30 in FIG. 4A). The minimum or maximum volume can be selected, for example, to accommodate the throughput (e.g., multiplexity), resolution, nucleotides, or analyte reactivity expected for downstream uses of the flow cell 30. For example, the volume can be about $1\times10^{-3}$ µm$^3$, at least about $1\times10^{-2}$ µm$^3$, at least about 0.1 µm$^3$, at least about 1 µm$^3$, at least about 10 µm$^3$, at least about 100 µm$^3$, or more or less.

The area occupied by each nano-depression opening can be selected based upon similar criteria as those set forth above for the volume. For example, the area for each nano-depression opening can be at least about $1\times10^{-3}$ µm$^2$, at least about $1\times10^{-2}$ µm$^2$, at least about 0.1 µm$^2$, at least about 1 µm$^2$, at least about 10 µm$^2$, at least about 100 µm$^2$, or more. Alternatively or additionally, the area can be at most about $1\times10^3$ µm$^2$, at most about 100 µm$^2$, at most about 10 µm$^2$, at most about 1 µm$^2$, at most about 0.1 µm$^2$, at most about $1\times10^{-2}$ µm$^2$, or less. The area occupied by each depression opening can be greater than, less than or between the values specified above.

The depth of each nano-depression 24 can be large enough to house a polymeric hydrogel (described below in reference to FIG. 4B). In an example, the depth may be at least about 0.1 µm, at least about 0.5 µm, at least about 1 µm, at least about 10 µm, at least about 100 µm, or more. Alternatively or additionally, the depth can be at most about $1\times10^3$ µm, at most about 100 µm, at most about 10 µm, or less. In some examples, the depth is about 0.4 µm. The depth of each depression 24 can be greater than, less than or between the values specified above.

In some instances, the diameter or length and width of each nano-depression 24 can range from about 10 nm to about 1000 nm. As examples, the diameter or length and width of each of the nano-depression 24 may be about 50 nm, about 0.1 µm, about 0.5 µm, or about 1 µm. Some resins may be imprinted with larger depressions, e.g., having a diameter or length and width of about 10 µm, about 100 µm, or more. In some examples of the nano-depressions 24, the diameter is or length and width are about 0.4 µm.

Flow Cells

As mentioned, the substrate 18 having the patterned, cured resin 28 thereon may be incorporated into a flow cell 30. An example flow cell 30 is shown in FIG. 4A. As will be discussed in reference to FIG. 4B, some examples of the flow cell 30A include two opposed sequencing surfaces 32, 34. In other examples, the flow cell 30B includes one sequencing surface 32 supported by a substrate 18 and an opposed lid 36 attached to the substrate 18.

The flow cell 30 includes flow channels 38. While several flow channels 38 are shown in FIG. 4A, it is to be understood that any number of flow channels 38 may be included in the flow cell 30 (e.g., a single channel, four channels, etc.). In some of the examples disclosed herein (FIG. 4B), each flow channel 38 is an area defined between two opposed sequencing surfaces 32, 34. In other of the examples disclosed herein (FIG. 4C), each flow channel 38 is an area defined between one sequencing surface (e.g., 32) and the opposed lid 36. Fluids can be introduced into and removed from the flow channels 38. Each flow channel 38 may be isolated from each other flow channel 38 in a flow cell 30 so that fluid introduced into any particular flow channel 38 does not flow into any adjacent flow channel 38.

In an example, the flow channel 38 has a rectangular configuration. The length and width of the flow channel 38 may be smaller, respectively, than the length and width of the substrate 18 so that a portion (e.g., surface 40) of the cured, patterned resin 28 (on the substrate 18) surrounding the flow channel 38 is available for attachment to another substrate 18 or the lid 36. In some instances, the width of each flow channel 38 can be about 1 mm, about 2.5 mm, about 5 mm, about 7 mm, about 10 mm, or more or less. The width and/or length of each flow channel 38 can be greater than, less than or between the values specified above. In another example, the flow channel 38 is square (e.g., 10 mm×10 mm)

The depth of each flow channel 38 can be as small as a few monolayers thick, for example, when microcontact, aerosol, or inkjet printing is used to deposit a separate material that defines the flow channel walls. For other examples, the depth of each flow channel 38 can be about 1 μm, about 10 μm, about 50 μm, about 100 μm, or more. In an example, the depth may range from about 10 μm to about 100 μm. In another example, the depth is about 5 μm or less. It is to be understood that the depth of each flow channel 38 be greater than, less than or between the values specified above. The depth of the flow channel 38 may also vary along the length and width of the flow cell 30, e.g., when patterned sequencing surface(s) 32, 34 is/are used.

Figure 4B:
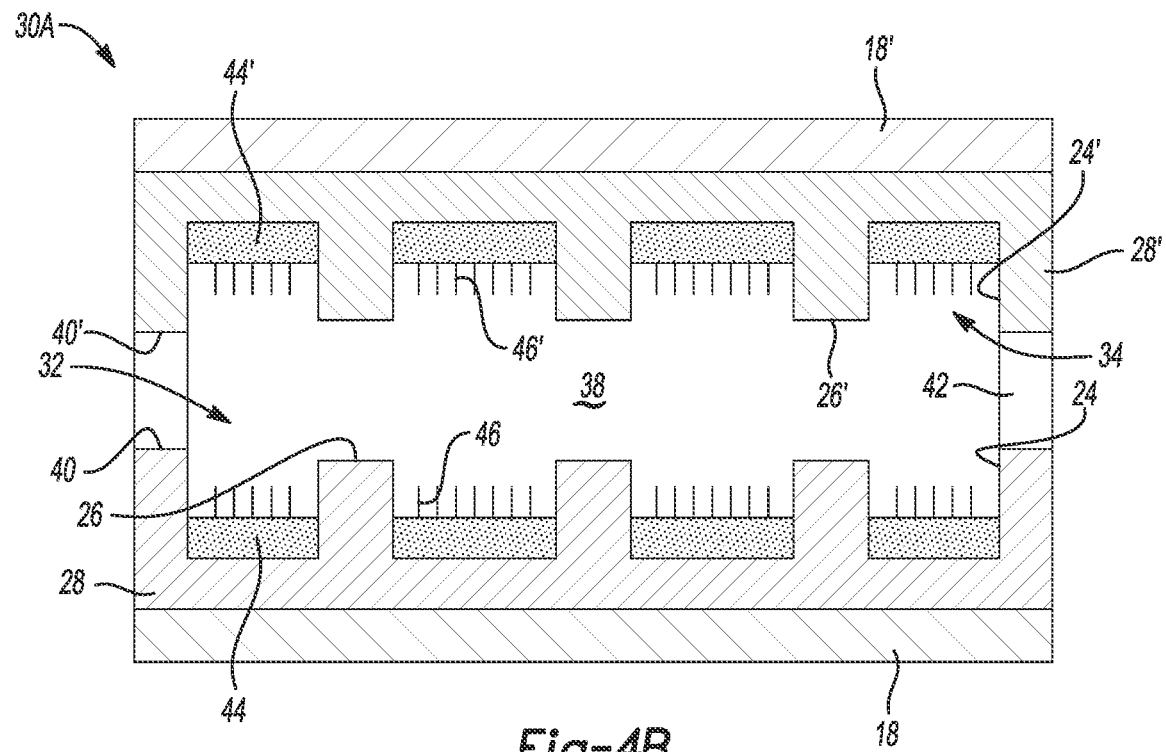
FIG. 4B is an enlarged, cross-sectional view, taken along the 4B-4B line of FIG. 4A, of an example of a flow channel and patterned sequencing surfaces in a first example flow cell.

FIG. 4B illustrates a cross-sectional view of the flow cell 30A including patterned opposed sequencing surfaces 32, 34. In an example, each of these surfaces 32, 34 may be prepared in the nano-depressions 24, 24' of the cured, patterned resins 28, 28' on the substrate 18, 18'. The substrates 18, 18' may be attached (e.g., through the surfaces 40, 40') to one another to form an example of the flow cell 30A. Any suitable bonding material 42, such as an adhesive, a radiation-absorbing material that aids in bonding, etc., may be used to bond the surfaces 40, 40' together.

The sequencing surfaces 32, 34 include a polymeric hydrogel 44, 44' and amplification primers 46, 46' attached to the polymeric hydrogel 44, 44'.

An example of the polymeric hydrogel 44, 44' includes an acrylamide copolymer, such as poly(N-(5-azidoacetamidylpentyl)acrylamide-co-acrylamide, PAZAM. PAZAM and some other forms of the acrylamide copolymer are represented by the following structure (I):

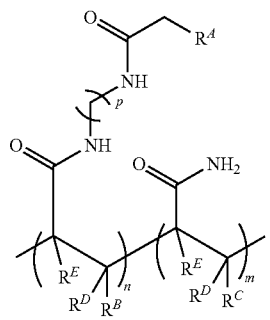

wherein:

$R^A$ is selected from the group consisting of azido, optionally substituted amino, optionally substituted alkenyl, optionally substituted alkyne, halogen, optionally substituted hydrazone, optionally substituted hydrazine, carboxyl, hydroxy, optionally substituted tetrazole, optionally substituted tetrazine, nitrile oxide, nitrone, sulfate, and thiol;

$R^B$ is H or optionally substituted alkyl;

$R^C$, $R^D$, and $R^E$ are each independently selected from the group consisting of H and optionally substituted alkyl;

each of the $—(CH_2)_p—$ can be optionally substituted;

p is an integer in the range of 1 to 50;

n is an integer in the range of 1 to 50,000; and m is an integer in the range of 1 to 100,000.

One of ordinary skill in the art will recognize that the arrangement of the recurring "n" and "m" features in structure (I) are representative, and the monomeric subunits may be present in any order in the polymer structure (e.g., random, block, patterned, or a combination thereof).

The molecular weight of PAZAM and other forms of the acrylamide copolymer may range from about 5 kDa to about 1500 kDa or from about 10 kDa to about 1000 kDa, or may be, in a specific example, about 312 kDa.

In some examples, PAZAM and other forms of the acrylamide copolymer are linear polymers. In some other examples, PAZAM and other forms of the acrylamide copolymer are a lightly cross-linked polymers.

In other examples, the polymeric hydrogel 44, 44' may be a variation of the structure (I). In one example, the acrylamide unit may be replaced with N,N-dimethylacrylamide

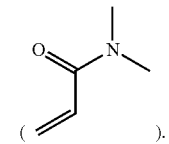

In this example, the acrylamide unit in structure (I) may be replaced with

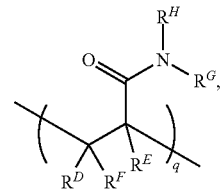

where $R^D$, $R^E$, and $R^F$ are each H or a C1-C6 alkyl, and $R^G$ and $R^H$ are each a C1-C6 alkyl (instead of H as is the case with the acrylamide). In this example, q may be an integer in the range of 1 to 100,000. In another example, the N,N-dimethylacrylamide may be used in addition to the acrylamide unit. In this example, structure (I) may include

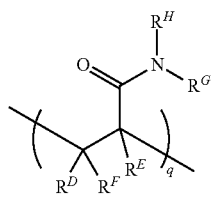

in addition to the recurring "n" and "m" features, where $R^D$, $R^E$, and $R^F$ are each H or a C1-C6 alkyl, and $R^G$ and $R^H$ are each a C1-C6 alkyl. In this example, q may be an integer in the range of 1 to 100,000.

As still another example, the polymeric hydrogel 44, 44' may include a recurring unit of each of structure (III) and (IV):

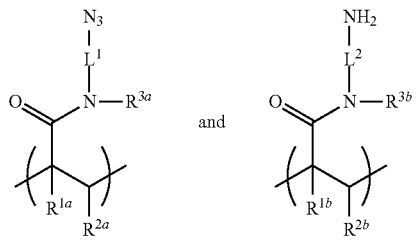

wherein each of $R^{1a}$, $R^{2a}$, $R^{1b}$ and $R^{2b}$ is independently selected from hydrogen, an optionally substituted alkyl or optionally substituted phenyl; each of $R^{3a}$ and $R^{3b}$ is independently selected from hydrogen, an optionally substituted alkyl, an optionally substituted phenyl, or an optionally substituted C7-C14 aralkyl; and each $L^1$ and $L^2$ is independently selected from an optionally substituted alkylene linker or an optionally substituted heteroalkylene linker.

It is to be understood that other molecules may be used to form the polymeric hydrogel 44, 44', as long as they are functionalized to graft oligonucleotide primers 46, 46' thereto. Other examples of suitable polymer layers include those having a colloidal structure, such as agarose; or a polymer mesh structure, such as gelatin; or a cross-linked polymer structure, such as polyacrylamide polymers and copolymers, silane free acrylamide (SFA), or an azidolyzed version of SFA. Examples of suitable polyacrylamide polymers may be synthesized from acrylamide and an acrylic acid or an acrylic acid containing a vinyl group, or from monomers that form [2+2] photo-cycloaddition reactions. Still other examples of suitable polymeric hydrogels 44, 44' include mixed copolymers of acrylamides and acrylates. A variety of polymer architectures containing acrylic monomers (e.g., acrylamides, acrylates etc.) may be utilized in the examples disclosed herein, such as branched polymers, including star polymers, star-shaped or star-block polymers, dendrimers, and the like. For example, the monomers (e.g., acrylamide, etc.) may be incorporated, either randomly or in block, into the branches (arms) of a star-shaped polymer.

To introduce the polymeric hydrogel 44, 44' into the nano-depressions 24, 24', a mixture of the polymeric hydrogel 44, 44' may be generated and then applied to the cured, patterned resins 28, 28'. In one example, the polymeric hydrogel 44, 44' may be present in a mixture (e.g., with water or with ethanol and water). The mixture may then be applied to the respective cured, patterned resins 28, 28' (including in the nano-depressions 24, 24') using spin coating, or dipping or dip coating, or flow of the material under positive or negative pressure, or another suitable technique. These types of techniques blanketly deposit the polymeric hydrogel 44, 44' on the cured, patterned resins 28, 28' (e.g., in the nano-depressions 24, 24' and on interstitial regions 26, 26' and surfaces 40, 40' adjacent thereto). Other selective deposition techniques (e.g., involving a mask, controlled printing techniques, etc.) may be used to specifically deposit the polymeric hydrogel 44, 44' in the nano-depressions 24, 24' and not on interstitial regions 26, 26' and surfaces 40, 40'.

In some examples, the cured, patterned resin surfaces (including the nano-depressions 24, 24') may be activated, and then the mixture (including the polymeric hydrogel 44, 44') may be applied thereto. In one example, a silane or silane derivative (e.g., norbornene silane) may be deposited on the cured, patterned resin surface using vapor deposition, spin coating, or other deposition methods. In another example, the cured, patterned resin surface may be exposed to plasma ashing to generate surface-activating agent(s) (e.g., —OH groups) that can adhere to the polymeric hydrogel 44, 44'.

Depending upon the chemistry of the polymeric hydrogel 44, 44', the applied mixture may be exposed to a curing process. In an example, curing may take place at a temperature ranging from room temperature (e.g., about 25° C.) to about 95° C. for a time ranging from about 1 millisecond to about several days.

Polishing may then be performed in order to remove the polymeric hydrogel 44, 44' from the interstitial regions 26, 26' at the perimeter of the nano-depressions 24, 24', while leaving the polymeric hydrogel 44, 44' on the surface in the nano-depressions 24, 24' at least substantially intact.

The sequencing surfaces 32, 34 also include amplification primers 46, 46' attached to the polymeric hydrogel 44, 44'.

A grafting process may be performed to graft the amplification primers 46, 46' to the polymeric hydrogel 44, 44' in the nano-depressions 24, 24'. In an example, the amplification primers 46, 46' can be immobilized to the polymeric hydrogel 44, 44' by single point covalent attachment at or near the 5' end of the primers 46, 46'. This attachment leaves i) an adapter-specific portion of the primers 46, 46' free to anneal to its cognate sequencing-ready nucleic acid fragment and ii) the 3' hydroxyl group free for primer extension. Any suitable covalent attachment may be used for this purpose. Examples of terminated primers that may be used include alkyne terminated primers (e.g., which may attach to an azide surface moiety of the polymeric hydrogel 44, 44'), or azide terminated primers (e.g., which may attach to an alkyne surface moiety of the polymeric hydrogel 44, 44').

Specific examples of suitable primers 46, 46' include P5 and P7 primers used on the surface of commercial flow cells sold by Illumina Inc. for sequencing on HISEQ™, HISEQX™, MISEQ™, MINISEQ™, NEXTSEQ™, NOVASEQ™, GENOME ANALYZER™, ISEQ™, and other instrument platforms. Both P5 and P7 primers may be grafted to each of the polymeric hydrogels 44, 44'.

In an example, grafting may involve flow through deposition (e.g., using a temporarily bound lid), dunk coating, spray coating, puddle dispensing, or by another suitable method that will attach the primer(s) 46, 46' to the polymeric hydrogel 44, 44'. Each of these example techniques may utilize a primer solution or mixture, which may include the primer(s) 46, 46', water, a buffer, and a catalyst. With any of the grafting methods, the primers 46, 46' react with reactive groups of the polymeric hydrogel 44, 44' in the nano-depressions 24, 24' and have no affinity for the surrounding cured, patterned resin 28, 28'. As such, the primers 46, 46' selectively graft to the polymeric hydrogel 44, 44'.

As shown in FIG. 4B, the substrates 18, 18' are attached to one another through the cured, patterned resins 28, 28' so that the sequencing surfaces 32, 34 face each other with the flow channel 38 defined therebetween.

The cured, patterned resins 28, 28' may be bonded to each other at some or all of the interstitial regions 26, 26' (such as perimeter surfaces 40, 40'). The bond that is formed may be a chemical bond, or a mechanical bond (e.g., using a fastener, etc.).

Any suitable technique, such as laser bonding, diffusion bonding, anodic bonding, eutectic bonding, plasma activation bonding, glass frit bonding, or other methods known in the art may be used to bond the surfaces 40, 40' together. In an example, a spacer layer (e.g., material 42) may be used to bond the surfaces 40, 40'. The spacer layer may be any material 42 that will seal at least some portion of the surfaces 40, 40' together. In some examples, the spacer layer can be a radiation-absorbing material that aids in bonding.

Figure 4C:
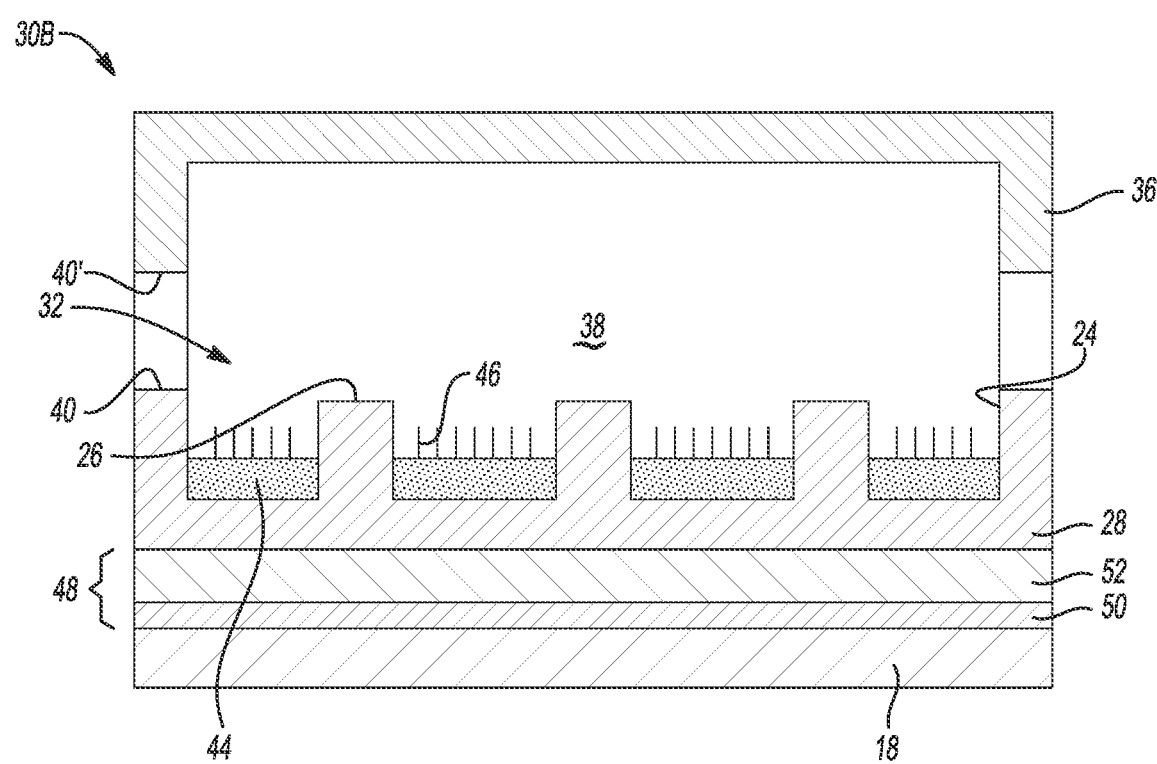
FIG. 4C is an enlarged, cross-sectional view, taken along the 4C-4C line of FIG. 4A, of an example of a flow channel and patterned sequencing surfaces in a second example flow cell.

In the example shown in FIG. 4C, the flow cell 30B includes a planar waveguide stack 48 positioned between the substrate 18 and the cured, patterned resin 28. In other examples, the planar waveguide stack 48 may be similar to the example shown in FIG. 4B and thus may be include two opposed planar waveguide stacks 48, which of which is associated with a respective sequencing surface 32, 34. The planar waveguide stack(s) 48 may include a grating layer 50 positioned on the substrate 18; and a planar waveguide layer 52 positioned on the grating layer 50. Any examples of the grating layer 50 and the planar waveguide layer 52 disclosed herein may be used. In one example, a refractive index of the interpenetrating polymer network of the cured, patterned resin 28 ranges from about 1.34 to about 1.50; and a refractive index of the planar waveguide layer 52 ranges from about 1.6 to about 2.5. These refractive indices are well controlled in order to i) get light propagation through the planar waveguide layer 52 through total internal reflection at its boundary with the grating layer 50; ii) tune the penetration depth of an evanescent wave into the patterned resin 28 (and specifically reaching the bottom of the nano-depressions 24); and iii) efficiently guide the light into the planar waveguide layer 52 after it hits the grating layer 50. It is also desirable to prevent the cured, patterned resin 28 from being an output coupler. This may be achieved by matching a refractive index of an imaging buffer (e.g., introduced into the nano-depressions 24, 24') with the refractive index of the cured, patterned resin 28.

The sequencing surface 32 (including the polymeric hydrogel 44 and the amplification primers 46) is formed in the nano-depressions 24 of the cured, patterned resin 28.

In this example, the lid 36 is bonded to the perimeter surfaces 40 of the cured, patterned resin 28 as described in reference to FIG. 4B.

Sequencing Method

Examples of the flow cell 30, 30A, 30B may be used in an ensemble sequencing technique, such as sequencing by synthesis (SBS). In ensemble sequencing, a template polynucleotide chain (not shown) that is to be sequenced may be formed on the flow cell 30, 30A, 30B using the amplification primers 46, 46'. At the outset of template polynucleotide chain formation, library templates may be prepared from any nucleic acid sample (e.g., a DNA sample or an RNA sample). The nucleic acid sample may be fragmented into single-stranded, similarly sized (e.g., <1000 bp) DNA or RNA fragments. During preparation, adapters may be added to the ends of these fragments. Through reduced cycle amplification, different motifs may be introduced in the adapters, such as sequencing binding sites, indices, and regions that are complementary to the primers 46, 46' in the nano-depressions 24, 24'. The final library templates include the DNA or RNA fragment and adapters at both ends. In some examples, the fragments from a single nucleic acid sample have the same adapters added thereto.

A plurality of library templates may be introduced to the flow cell 30, 30A, 30B. Multiple library templates are hybridized, for example, to one of two types of primers 46, 46' immobilized in the nano-depressions 24, 24'.

Cluster generation may then be performed. In one example of cluster generation, the library templates are copied from the hybridized primers by 3' extension using a high-fidelity DNA polymerase. The original library templates are denatured, leaving the copies immobilized in the nano-depressions 24, 24'. Isothermal bridge amplification or some other form of amplification may be used to amplify the immobilized copies. For example, the copied templates loop over to hybridize to an adjacent, complementary primer 46, 46', and a polymerase copies the copied templates to form double stranded bridges, which are denatured to form two single stranded strands. These two strands loop over and hybridize to adjacent, complementary primers 46, 46' and are extended again to form two new double stranded loops. The process is repeated on each template copy by cycles of isothermal denaturation and amplification to create dense clonal clusters. Each cluster of double stranded bridges is denatured. In an example, the reverse strand is removed by specific base cleavage, leaving forward template polynucleotide strands. Clustering results in the formation of several template polynucleotide chains in each nano-depression 24, 24'. This example of clustering is bridge amplification, and is one example of the amplification that may be performed. It is to be understood that other amplification techniques may be used, such as the exclusion amplification (Examp) workflow (Illumina Inc.).

A sequencing primer may be introduced that hybridizes to a complementary sequence on the template polynucleotide chain. This sequencing primer renders the template polynucleotide chain ready for sequencing.

To initiate sequencing, an incorporation mix may be added to the flow cell 30, 30A, 30B. In one example, the incorporation mix includes a liquid carrier, a polymerase, and 3' OH blocked nucleotides. When the incorporation mix is introduced into the flow cell 30, 30A, 30B, the fluid enters the flow channel 38 and the nano-depressions 24, 24' (where the template polynucleotide chains are present).

The 3' OH blocked nucleotides are added to the sequencing primer (thereby extending the sequencing primer) in a template dependent fashion such that detection of the order and type of nucleotides added to the sequencing primer can be used to determine the sequence of the template. More particularly, one of the nucleotides is incorporated, by a respective polymerase, into a nascent strand that extends the sequencing primer and that is complementary to the template polynucleotide chain. In other words, in at least some of the template polynucleotide chains across the flow cell 30, 30A, 30B, respective polymerases extend the hybridized sequencing primer by one of the nucleotides in the incorporation mix.

In this example method, after incorporation of the nucleotide base into the nascent strand, the incorporation mix, which includes any non-incorporated 3' OH blocked nucleotides, may be removed from the flow cell 30, 30A, 30B. This may be accomplished using a washing solution (e.g., buffer).

The 3' OH blocked nucleotides include a reversible termination property (e.g., the 3' OH blocking group) that terminates further primer extension once a nucleotide has been added to the sequencing primer. Without further incorporation taking place, the most recently incorporated nucleotides can be detected through an imaging event. During an imaging event, an illumination system (not shown) may provide an excitation light to the flow channel 38 and nano-depressions 24, 24'. If the flow cell 30B is used, waveguide based illumination may be used.

A cleavage mix may then be introduced into the flow cell 30, 30A, 30B. In the examples disclosed herein, the cleavage mix is capable of i) removing the 3' OH blocking group from the incorporated nucleotides, and ii) cleaving any detectable label from the incorporated nucleotides. Removal of the 3' OH blocking group enables a subsequent sequencing cycle to be performed.

Examples of 3' OH blocking groups and suitable de-blocking agents/components in the cleavage mix may include: ester moieties that can be removed by base hydrolysis; allyl-moieties that can be removed with NaI, chlorotrimethylsilane and $Na_2S_2O_3$ or with Hg(II) in acetone/water; azidomethyl which can be cleaved with phosphines, such as tris(2-carboxyethyl)phosphine (TCEP) or tri(hydroxypropyl)phosphine (THP); acetals, such as tert-butoxyethoxy which can be cleaved with acidic conditions; MOM ($—CH_2OCH_3$) moieties that can be cleaved with $LiBF_4$ and $CH_3CN/H_2O$; 2,4-dinitrobenzene sulfenyl which can be cleaved with nucleophiles such as thiophenol and thiosulfate; tetrahydrofuranyl ether which can be cleaved with Ag(I) or Hg(II); and 3' phosphate which can be cleaved by phosphatase enzymes (e.g., polynucleotide kinase).

Wash(es) may take place between the various fluid delivery steps. The SBS cycle can then be repeated n times to extend the sequencing primer by n nucleotides, thereby detecting a sequence of length n. In some examples, paired-end sequencing may be used, where the forward strands are sequenced and removed, and then reverse strands are constructed and sequenced.

While SBS has been described in detail, it is to be understood that the flow cells 30, 30A, 30B described herein may be utilized with other sequencing protocol, for genotyping, or in other chemical and/or biological applications. In some instances, the primers of the flow cell may be selected to enable simultaneous paired-end sequencing, where both forward and reverse strands are present on the polymeric hydrogel 44, 44', allowing for simultaneous base calling of each read. Sequential and simultaneously paired-end sequencing facilitates detection of genomic rearrangements and repetitive sequence elements, as well as gene fusions and novel transcripts. In another example, the flow cells 30, 30A, 30B disclosed herein may be used for on-flow cell library generation.

To further illustrate the present disclosure, examples are given herein. It is to be understood that these examples are provided for illustrative purposes and are not to be construed as limiting the scope of the present disclosure.

NON-LIMITING WORKING EXAMPLES

Example 1

2 control resins (6 and 7) were prepared. 5 different resin mixtures (1-5) were prepared by combining the control resins 6 and 7 at the appropriate ratio. In control resin 7, and thus each of the resin mixtures 1-5, the epoxy-based monomer system included a 1:3 mixture of:

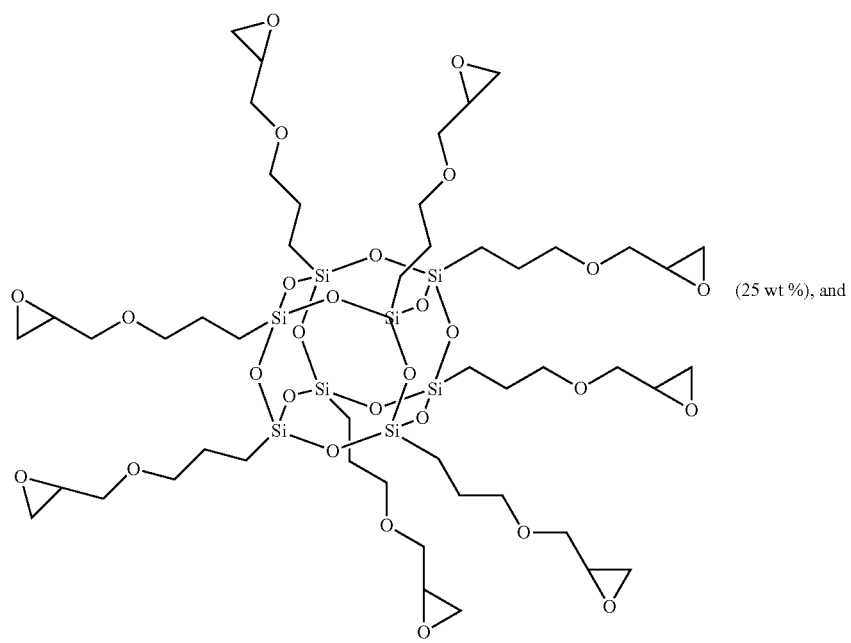 (25 wt %), and

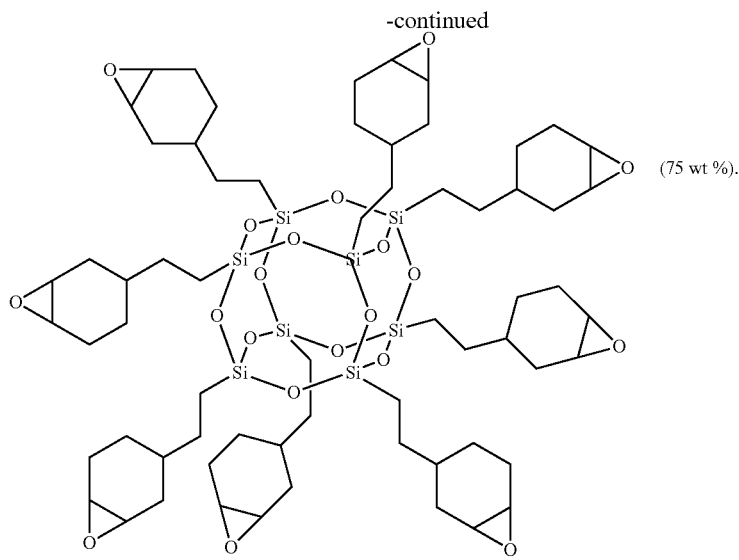

(75 wt %).

In control resin 6, and thus each of these resin mixtures, the acryloyl-based monomer system included:

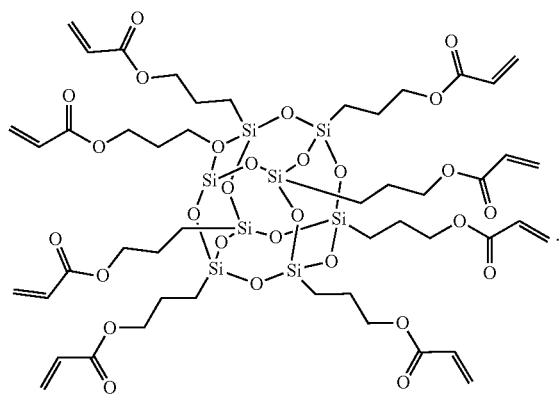

The monomer content of the mixtures and controls are shown in Table 1.

TABLE 1

| Resin ID | Cationically Polymerizable Monomer: 1:3 mixture of Epoxy monomers (wt % of total monomers) | Free Radical Polymerizable Monomer: Acrylol monomer (wt % of total monomers) |
|---|---|---|
| Resin Mixture 1 | 10 | 90 |
| Resin Mixture 2 | 25 | 75 |
| Resin Mixture 3 | 50 | 50 |
| Resin Mixture 4 | 75 | 25 |
| Resin Mixture 5 | 90 | 10 |
| Control Resin 6 | 0 | 100 |
| Control Resin 7 | 100 | 0 |

Control resin 6 included 4 wt % of 2,2-dimethoxy-2-phenylacetophenone (with respect to monomer) as a free radical photoinitiator, and control resin 7 included 4 wt % of Bis(4-methylphenyl)iodonium hexafluorophosphate (with respect to monomer) as a cationic photoinitiator and 4 wt % isopropyl-9H-thioxanthen-9-one (with respect to monomer) as a sensitizer. The control resins were diluted in propylene glycol monomethyl ether acetate to a solid concentration of 8%. The control resins were then mixed in appropriate ratios to obtain each of the resin mixtures 1-5. Each mixture and control resin was spin coated on a silicon wafer. The refractive index and thickness of each mixture and control resin were measured before curing.

Each mixture and control resin was cured using UV exposure. The refractive index and thickness of each cured resin were measured after curing.

The refractive index results are shown in FIG. 5A and the thickness results are shown in FIG. 5B. The results in FIG. 5A indicate that varying the monomer ratio in the mixtures results in lowering the resin layer refractive index between 1.51 (100% epoxy—control resin 7) and 1.49 (100% acrylo—control resin 6). The results in FIG. 5B indicate that decreasing the epoxy monomer ratio in the mixtures resulted in thinner resin layers.

Example 2

Several different resin mixtures were prepared in a similar manner as Example 1. The monomer content of the mixtures is shown in Table 2.

The following acronyms are used in Table 2: 2,4,6,8-tetramethyl-2,4,6,8-tetrakis(propyl glycidyl ether)cyclotetrasiloxane: G-D4 Tetrakis(epoxycyclohexyl ethyl)tetramethyl cyclotetrasiloxane: EC-D4 Poly(dimethylsiloxane), diglycidyl ether terminated: G-PDMS Poly(propylene glycol) diglycidyl ether: PPGGE 2,2,3,3,4,4,5,5-octafluoro-1,6-hexanediol diacrylate: BFA Pentaerythritol tetraacrylate: PETA Glycerol 1,3-diglycerolate diacrylate: GDA

TABLE 2

| | Cationically Polymerizable Monomer: Epoxy (wt % of total monomers) | | | | Free Radical Polymerizable Monomer: Acrylol (wt % of total monomers) | | |
|---|---|---|---|---|---|---|---|
| Resin ID | G-D4 | EC-D4 | G-PDMS | PPGGE | BFA | PETA | GDA |
| RM 8* | — | — | — | 50 | 50 | — | — |
| RM 9 | — | — | — | 25 | 75 | — | — |
| RM 10 | — | 10 | — | — | 90 | — | — |
| RM 11 | — | 25 | — | — | 75 | — | — |
| RM 12 | — | 50 | — | — | 50 | — | — |
| RM 13 | — | 75 | — | — | 25 | — | — |
| RM 14 | 12.5 | 12.5 | — | — | 75 | — | — |
| RM 15 | 25 | 25 | — | — | 50 | — | — |
| RM 16 | 37.5 | 37.5 | — | — | 25 | — | — |
| RM 17 | 12.5 | 12.5 | — | — | — | — | 75 |
| RM 18 | 25 | 25 | — | — | — | — | 50 |
| RM 19 | 37.5 | 37.5 | — | — | — | — | 25 |
| RM 20 | — | — | 50 | — | — | — | 50 |
| RM 21 | — | — | 25 | — | — | 75 | — |
| RM 22 | — | — | 50 | — | — | 50 | — |
| RM 23 | — | — | 75 | — | — | 25 | — |
| RM 24 | — | — | — | 25 | — | — | 75 |
| RM 25 | — | — | — | 50 | — | — | 50 |
| RM 26 | — | — | — | 75 | — | — | 25 |
| RM 27 | — | — | — | 25 | — | 75 | — |
| RM 28 | — | — | — | 50 | — | 50 | — |
| RM 29 | — | — | — | 75 | — | 25 | — |

*leveling agent added

Each resin mixture was filtered and spin coated on a silicon wafer. Imprinting was tested by pressing either a silicon-acrylate working stamp (Si-WS) or a fluorinated working stamp (F-WS) into the coated resin mixture and curing was performed.

The resin mixtures and cured resins were tested for coatability (uniform wetting of the substrate), wetting with the working stamp (efficient filling of the WS features), effective curing, imprintability with the working stamp (ease of WS release and visual quality of the diffraction pattern), refractive index (of the cured resin) and/or thickness (of the cured resin). By coatability, it is meant that the resin mixture formed a substantially uniform film on the substrate. By imprintability, it is meant that the features of the working stamp were successfully transferred to the cured resin without sticking, feature dimension loss, etc. The resin, type(s) of working stamp, and results are shown in Table 3. If two working stamp types and a single result are provided, this indicates that the result was the same for both working stamps. If two working stamps and two results are provided, this indicates the result for the respective working stamp. For example, if the working stamp type is Si-WS & F-WS and the imprint results is yes & no, then the Si-WS was imprinted successfully and F-WS was not successfully imprinted.

TABLE 3

| Resin ID | Working Stamp | Coatable | WS Wetting | Cure | Imprint | RI @532 nm | Thickness (nm) |
|---|---|---|---|---|---|---|---|
| RM 8 | Si-WS | + | yes | yes | yes | 1.49611 | 461 ± 2 |
| RM 9 | Si-WS | + | yes | yes | no | 1.49292 | 542 ± 3 |
| RM 10 | Si-WS | +/− | yes | no | no | 1.56536 | 263 ± 2 |
| RM 11 | Si-WS | +/− | yes | yes | no | 1.54753 | 354 ± 3 |
| RM 12 | Si-WS | +/− | yes | yes | no | 1.48276 | 495 ± 2 |
| RM 13 | Si-WS | +/− | yes | no | no | 1.51161 | 228 ± 4 |
| RM 14 | Si-WS | +/− | yes | yes | no | 1.61368 | 227 ± 2 |
| RM 15 | Si-WS | +/− | yes | yes | no | 1.48718 | 333 ± 2 |
| RM 16 | Si-WS | +/− | yes | yes | no | 1.48141 | 452 ± 2 |
| RM 17 | Si-WS & F-WS | + | yes | yes | no | 1.51031 | 553 ± 1 |
| RM 18 | Si-WS & F-WS | + | yes | yes | no | 1.51253 | 557 ± 1 |
| RM 19 | Si-WS & F-WS | + | yes | yes | no | 1.51734 | 582 ± 1 |
| RM 20 | Si-WS & F-WS | +/− | yes | yes | no | 1.47746 | 507 ± 2 |
| RM 21 | Si-WS & F-WS | + | yes | yes | no | 1.46611 | 496 ± 2 |
| RM 22 | Si-WS & F-WS | + | yes | yes | no | 1.52955 | 401 ± 2 |
| RM 23 | Si-WS & F-WS | + | yes | yes | no | 1.52738 | 410 ± 2 |

TABLE 3-continued

| Resin ID | Working Stamp | Coatable | WS Wetting | Cure | Imprint | RI @532 nm | Thickness (nm) |
|---|---|---|---|---|---|---|---|
| RM 24 | Si-WS & F-WS | + | yes | yes | yes & no | 1.50841 | 650 ± 1 |
| RM 25 | Si-WS & F-WS | + | yes | yes | yes & no | 1.50056 | 520 ± 1 |
| RM 26 | Si-WS & F-WS | + | yes | yes | yes & no | 1.48861 | 494 ± 1 |
| RM 27 | Si-WS & F-WS | + | yes | yes | no | 1.50834 | 512 ± 1 |
| RM 28 | Si-WS & F-WS | + | yes | yes | no | 1.50356 | 470 ± 1 |
| RM 29 | Si-WS & F-WS | + | yes | yes | no | 1.50318 | 453 ± 1 |

With resin mixtures 8 and 9 (different ratios of PPGGE and BFA), uniform (+) films were coated and UV curing was efficient. For resin mixture 8, working stamp wetting was efficient and imprintability was obtained. For resin mixture 9, a leveling agent may be added to achieve imprintability.

With resin mixtures 10 through 13 (different ratios of EC-D4 and BFA), moderately uniform (+/−) films were coated. Curing was not always efficient, for example, when the acrylol monomer was too high (90%) or the epoxy monomer was too high (75%). For this combination, the ratio of EC-D4:BFA should range from about 50:50 to about 25:75. Also with resin mixtures 10 through 13, efficient working stamp wetting was achieved, but no pattern could be successfully transferred from the stamp onto the resin because working stamp release was undesirable. EC-D4 is a very viscous compound, and thus reducing this amount may be desirable (as shown in resin mixtures 11 and 12). Moreover, a leveling agent may be added to improve working stamp release.

With resin mixtures 14 through 16 (different ratios of EC-D4/G-D4 mix and BFA), moderately (+/−) uniform films were coated. Curing was efficient for all of these examples. Also with resin mixtures 14 through 16, efficient working stamp wetting was achieved, but no pattern could be successfully transferred from the stamp onto the resin because working stamp release was undesirable. Film thickness increased as G-D4 content increased. Moreover, a leveling agent may be added to improve working stamp release.

With resin mixtures 17 through 19 (different ratios of G-D4 and GDA), uniform (+) films were coated. Curing was efficient for all of these examples. Also with resin mixtures 17 through 19, efficient working stamp wetting was achieved, but no pattern could be successfully transferred from the stamp onto the resin because working stamp release was undesirable. A leveling agent may be added to improve working stamp release.

With resin mixture 20 (G-PDMS and GDA), a moderately (+/−) uniform film was coated and curing was efficient. Also with resin mixture 20, efficient working stamp wetting was achieved, but no pattern could be successfully transferred from the stamp onto the resin. The PDMS material is soft, and perhaps increasing the GDA amount could improve imprintability. Moreover, a leveling agent may be added to improve working stamp release.

With resin mixtures 21 through 23 (different ratios G-PDMS and PETA), uniform (+) films were coated. Curing was efficient. Also with resin mixtures 21 through 23, efficient working stamp wetting was achieved, but no pattern could be successfully transferred from the stamp onto the resin. The PDMS material is soft, and perhaps increasing the PETA amount could improve imprintability. Moreover, a leveling agent may be added to improve working stamp release.

With resin mixtures 24 through 26 (different ratios PPGGE and GDA), uniform (+) films were coated. UV curing was efficient. For resin mixtures 24 through 26, working stamp wetting was efficient and imprintability was obtained when using the Si-WS. However, no imprint transfer could be achieved with the F-WS. An impact on viscosity can also be observed in these examples because as the epoxy (PPGGE) amount is increased, the cured resin thickness is also increased. The impact of the acrylol monomer (GDA, RI=1.446 and PPGGE, RI=1.457) on the refractive index is also observable in these resin mixtures.

With resin mixtures 27 through 29 (different ratios PPGGE and PETA), uniform (+) films were coated. UV curing was efficient. For resin mixtures 27 through 29, working stamp wetting was efficient but imprintability was not obtained because working stamp release was undesirable. For these example mixtures, a leveling agent may be added to improve working stamp release. An impact on viscosity can also be observed in these examples because as the acryloyl (PETA) amount is increased, the cured resin thickness is also increased.

The results of this example illustrate how different monomers and different amounts of the monomers in a resin mixture can be altered in order to tune one or more properties of the resin mixture and/or of the resulting interpenetrating network. Additionally, the results for resin mixtures 24 through 26 indicate how the monomers and weight ratio of the monomers can be selected to generate a resin mixture that is imprintable using a particular working stamp.

Additional Notes

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

Reference throughout the specification to "one example", "another example", "an example", and so forth, means that a particular element (e.g., feature, structure, and/or characteristic) described in connection with the example is included in at least one example described herein, and may or may not be present in other examples. In addition, it is to be understood that the described elements for any example may be combined in any suitable manner in the various examples unless the context clearly dictates otherwise.

It is to be understood that the ranges provided herein include the stated range and any value or sub-range within the stated range, as if such values or sub-ranges were explicitly recited. For example, a range of about 225 nm to about 600 nm, should be interpreted to include not only the explicitly recited limits of about 225 nm to about 600 nm, but also to include individual values, such as about 358 nm, about 375.5 nm, etc., and sub-ranges, such as from about 355 nm to about 395 nm, from about 350 nm to about 575 nm, etc. Furthermore, when "about" and/or "substantially" are/is utilized to describe a value, they are meant to encompass minor variations (up to +/−10%) from the stated value.

While several examples have been described in detail, it is to be understood that the disclosed examples may be modified. Therefore, the foregoing description is to be considered non-limiting.

What is claimed is:

1. A flow cell, comprising:
   a substrate; and
   a cured, patterned resin on the substrate, the cured, patterned resin including nano-depressions separated by interstitial regions, the nano-depressions each having a largest opening dimension ranging from about 10 nm to about 1000 nm, and the cured, patterned resin including an interpenetrating polymer network including an epoxy-based polymer and a (meth)acryloyl-based polymer, wherein a weight ratio of the epoxy-based polymer to the (meth)acryloyl-based polymer ranges from about 25:75 to about 75:25.

2. The flow cell as defined in claim 1, further comprising:
   a grating layer positioned on the substrate; and
   a planar waveguide layer positioned on the grating layer.

3. The flow cell as defined in claim 2, wherein:
   a refractive index of the interpenetrating polymer network ranges from about 1.35 to about 1.52; and
   a refractive index of the planar waveguide layer ranges from about 1.6 to about 2.5.

4. The flow cell as defined in claim 1, further comprising:
   a hydrogel positioned in each of the nano-depressions; and
   amplification primers attached to the hydrogel.

5. The flow cell as defined in claim 1, wherein a thickness of the cured, patterned resin ranges from about 225 nm to about 600 nm.

6. The flow cell as defined in claim 1, wherein:
   the epoxy-based polymer is formed from a multi-functional epoxy monomer and the multi-functional epoxy monomer is Poly(propylene glycol) diglycidyl ether:

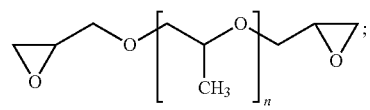

the (meth)acryloyl-based polymer is formed from a multi-functional (meth)acryloyl monomer and the multi-functional (meth)acryloyl monomer is 2,2,3,3,4,4,5,5-octafluoro-1,6-hexanediol diacrylate:

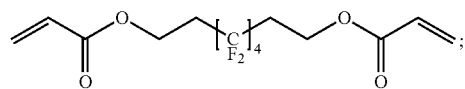

and
   the predetermined weight ratio is about 50:50.

7. The flow cell as defined in claim 1, wherein:
   the epoxy-based polymer is formed from a multi-functional epoxy monomer and the multi-functional epoxy monomer is Poly(propylene glycol) diglycidyl ether:

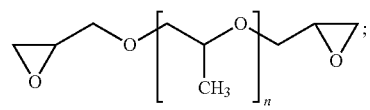

the (meth)acryloyl-based polymer is formed from a multi-functional (meth)acryloyl monomer and the multi-functional (meth)acryloyl monomer is Glycerol 1,3-diglycerolate diacrylate:

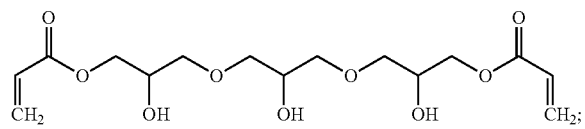 [SMILES: C=CC(=O)OCC(O)COCC(O)COCC(O)COC(=O)C=C]

and
   the predetermined weight ratio ranges from about 25:75 to about 75:25.

8. A method, comprising:
   applying a resin mixture on a substrate of a flow cell, the resin mixture including a multi-functional epoxy monomer and a multi-functional (meth)acryloyl monomer at a weight ratio ranging from about 25:75 to about 75:25;
   imprinting the resin mixture with a working stamp having a plurality of nano-features; and
   curing the resin mixture while the working stamp is in place, thereby forming an interpenetrating polymer network including an epoxy-based polymer and a (meth)acryloyl-based polymer at a weight ratio ranging from about 25:75 to about 75:25 that is imprinted with flow cell nano-depressions separated by interstitial regions, the nano-depressions each having a largest opening dimension ranging from about 10 nm to about 1000 nm.

9. The method as defined in claim 8, wherein the multi-functional epoxy monomer is selected from the group consisting of:
   i) 2,4,6,8-tetramethyl-2,4,6,8-tetrakis(propyl glycidyl ether)cyclotetrasiloxane:

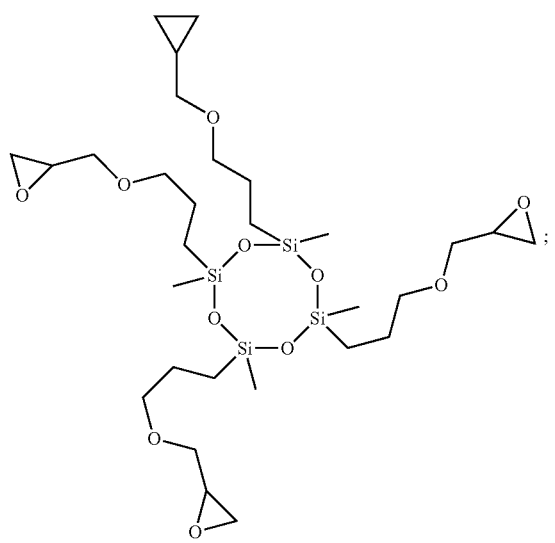 [SMILES: C[Si]1(CCCOCC2CC2)O[Si](C)(CCCOCC2CO2)O[Si](C)(CCCOCC2CO2)O[Si](C)(CCCOCC2CO2)O1]

ii) Tetrakis(epoxycyclohexyl ethyl)tetramethyl cyclo-tetrasiloxane:

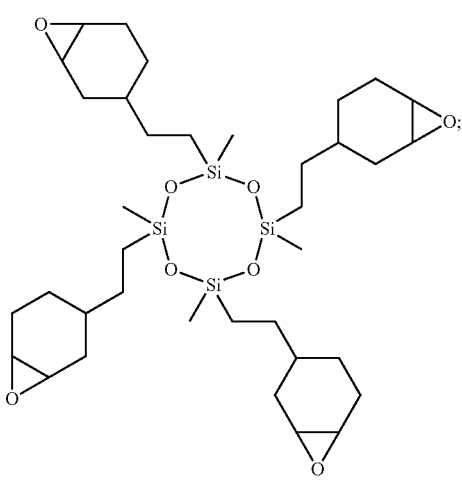 [SMILES: C[Si]1(CCC2CCC3OC3C2)O[Si](C)(CCC2CCC3OC3C2)O[Si](C)(CCC2CCC3OC3C2)O[Si](C)(CCC2CCC3OC3C2)O1]

iii) Poly(dimethylsiloxane), diglycidyl ether terminated:

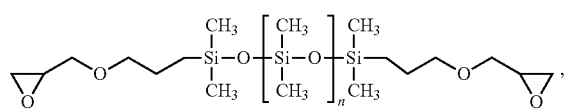

wherein 4<n<8;

iv) Poly(propylene glycol) diglycidyl ether:

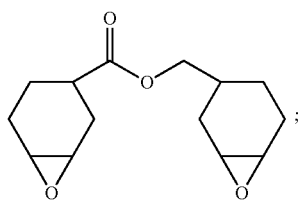 [SMILES: O=C(OCC1CCC2OC2C1)C1CCC2OC2C1]

wherein 5<n<10;

v) 3,4-Epoxycyclohexylmethyl 3,4-epoxycyclohexan-ecarboxylate:

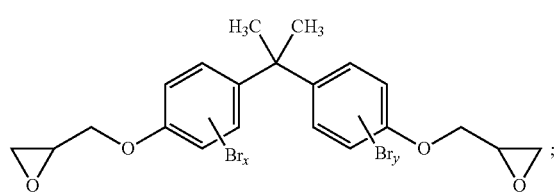

vi) Bisphenol A diglycidyl ether, brominated:

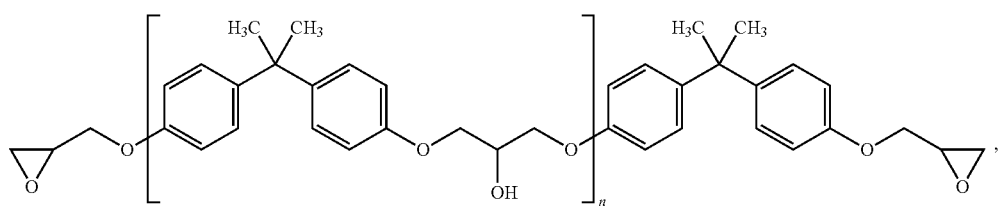

4.5 < (x+y) < 7 vii) Poly(Bisphenol A-co-epichlorohydrin), glycidyl end-capped:

wherein 0<n<2;
viii) Bisphenol A propoxylate diglycidyl ether:

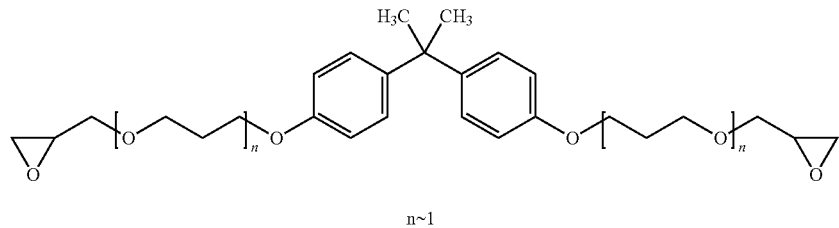

n~1 ix) Monophenyl functional tris(epoxy terminated polydimethylsiloxane):

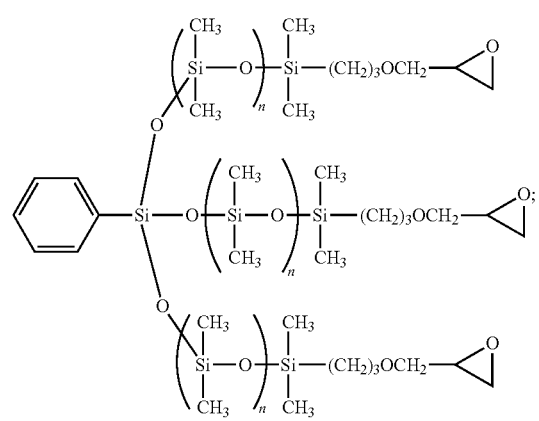

x) Trimethylolpropane triglycidyl ether:

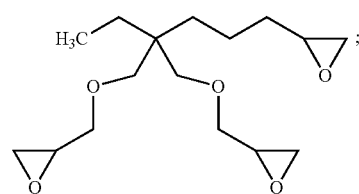 [SMILES: CCC(CCCC1CO1)(COCC1CO1)COCC1CO1]

xi) 2,2'-(2,2,3,3,4,4,5,5-Octafluorohexane-1,6-diyl)bis(oxirane):

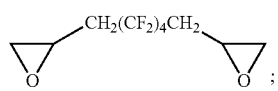

xii) 1,3-Bis(3-glycidoxypropyl)tetramethyldisiloxane:

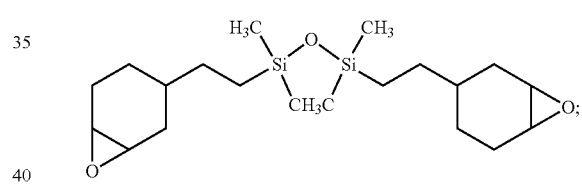

xiii) 1,3 Bis[2(3,4 epoxycyclohex-1-yl)ethyl]tetra-methyldisiloxane:

xiv) Glycidyl polyoctahedral silsesquioxane:

and xv) Epoxycyclohexyl polyoctahedral silsesquioxane:

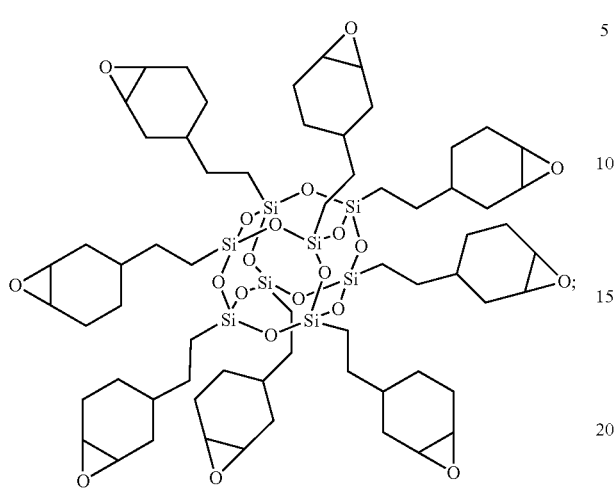

xvi) Tris(4-hydroxyphenyl)methane triglycidyl ether:

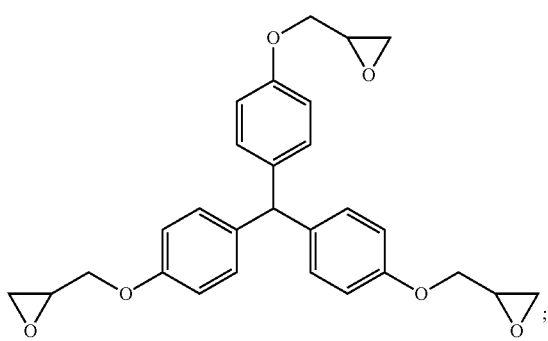 [SMILES: c1cc(C(c2ccc(OCC3CO3)cc2)c2ccc(OCC3CO3)cc2)ccc1OCC1CO1]

xvii) 4,4'-Methylenebis(N,N-diglycidylaniline):

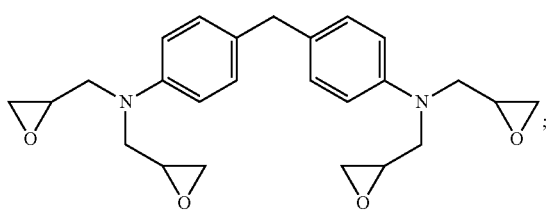 [SMILES: c1cc(N(CC2CO2)CC2CO2)ccc1Cc1ccc(N(CC2CO2)CC2CO2)cc1]

and xviii) any combination of i) through xvii).

10. The method as defined in claim 8, wherein the multi-functional (meth)acryloyl monomer is selected from the group consisting of:

i) 2,2,3,3,4,4,5,5-octafluoro-1,6-hexanediol diacrylate:

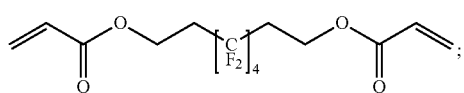

ii) Pentaerythritol tetraacrylate:

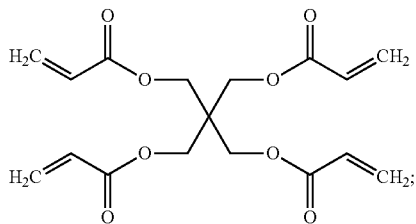

iii) Pentaerythritol triacrylate:

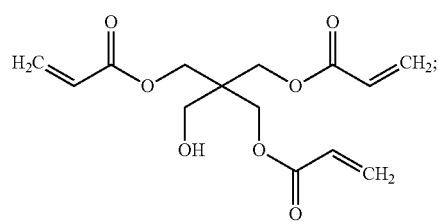 [SMILES: C=CC(=O)OCC(CO)(COC(=O)C=C)COC(=O)C=C]

iv) Glycerol 1,3-diglycerolate diacrylate:

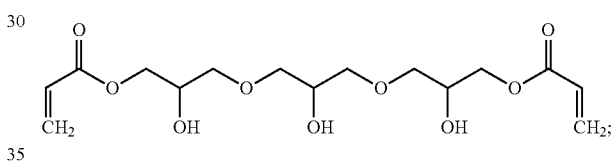

v) Poly(ethylene glycol) dimethacrylate:

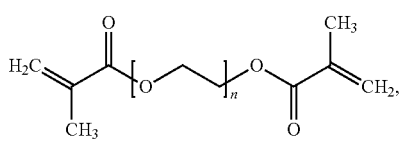

wherein $8<n<10$;

vi) Glycerol dimethacrylate, mixture of isomers:

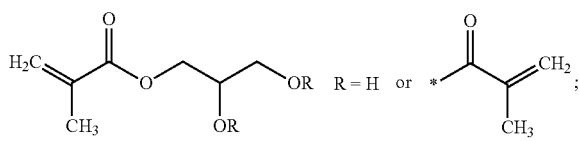

vii) 3-(Acryloyloxy)-2-hydroxypropyl methacrylate:

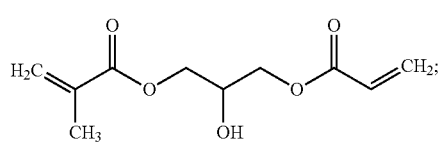

viii) Ethylene glycol dimethacrylate:

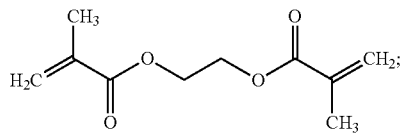

ix) Bis(2-methacryloyl)oxyethyl disulfide:

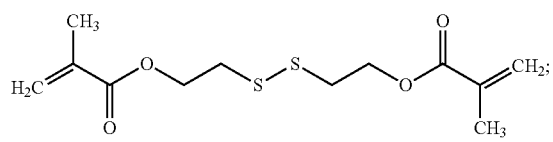

x) Tricyclodecane dimethanol diacrylate:

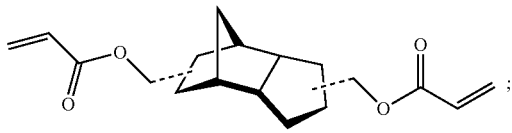

xi) Bisphenol A glycerolate (1 glycerol/phenol) diacrylate:

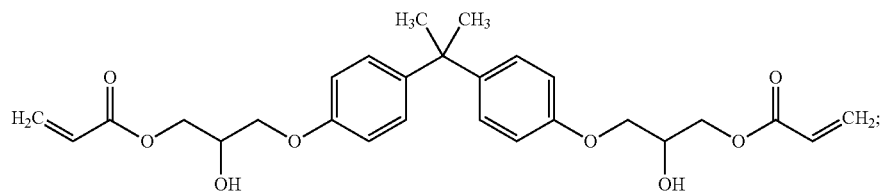 [SMILES: C=CC(=O)OCC(O)COc1ccc(C(C)(C)c2ccc(OCC(O)COC(=O)C=C)cc2)cc1]

xii) Bisphenol A dimethacrylate:

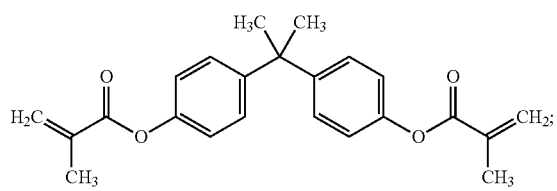 [SMILES: C=C(C)C(=O)Oc1ccc(C(C)(C)c2ccc(OC(=O)C(=C)C)cc2)cc1]

xiii) Methacryloxypropyl terminated polydimethylsiloxane:

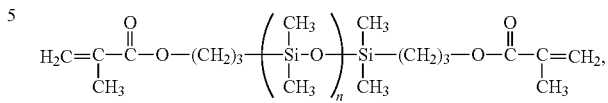

wherein n is selected to render the monomer with a molecular weight of about 420 g/mol, 950 g/mol, 4,000 g/mol, 10,000 g/mol, or 25,000 g/mol;

xiv) Zirconium bromonorbornanelactone carboxylate triacrylate:

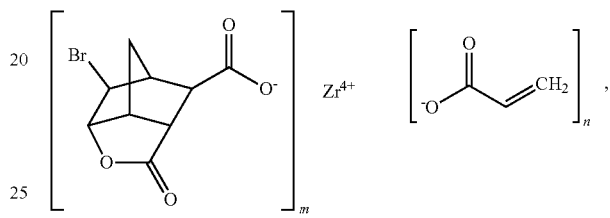

wherein m ranges from 0 to 4, n ranges from 0 to 4, and m+n=4;

xv) Zirconium acrylate:

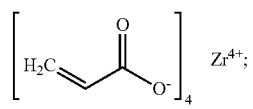

xvi) Hafnium carboxyethyl acrylate:

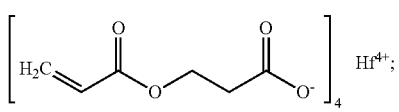

xvii) Acrylo polyoctahedral silsesquioxane:
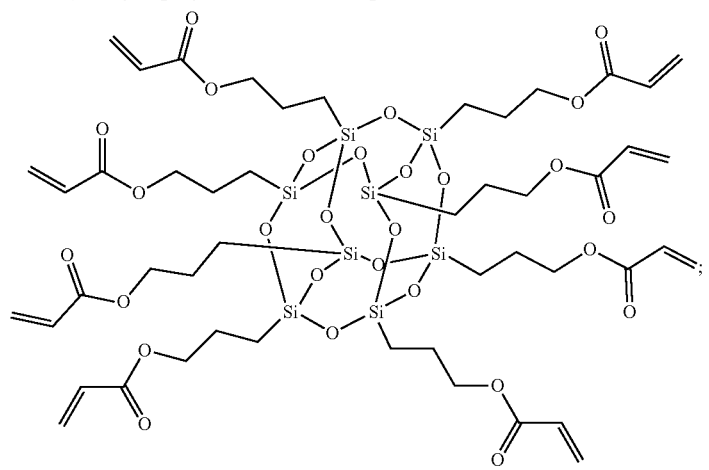
xviii) Methacryl polyoctahedral silsesquioxane:
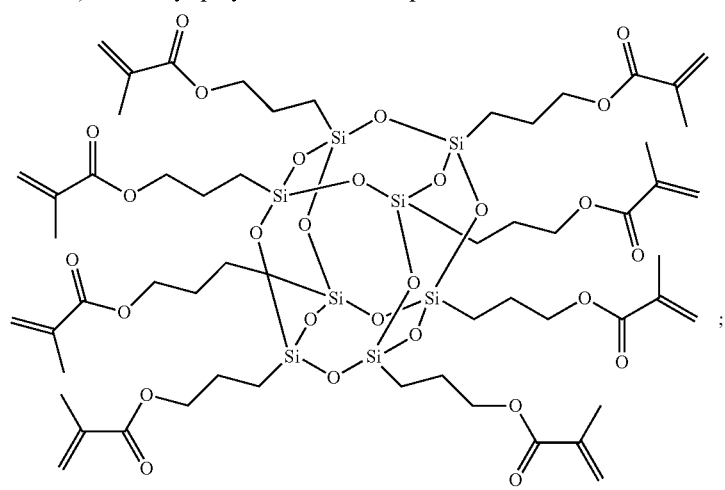
xix) 2,4,6,8-Tetramethyl-2,4,6,8-tetrakis(3-acryloyloxy-propyl) cyclotetrasiloxane:
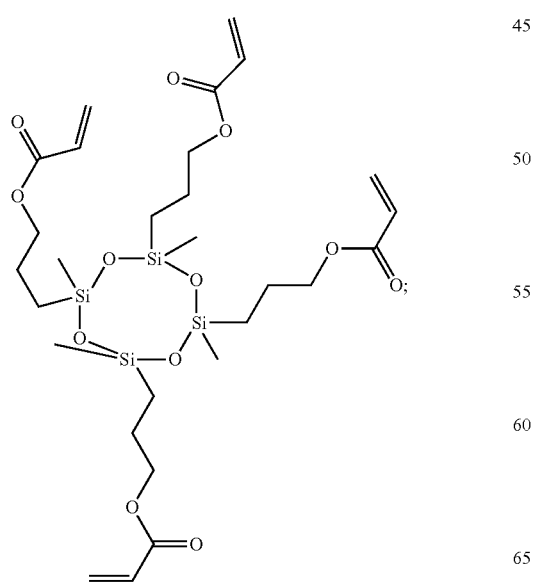

and xx) any combination of i) through xix).

11. The method as defined in claim 8, wherein:
the multi-functional epoxy monomer is Poly(propylene glycol) diglycidyl ether:

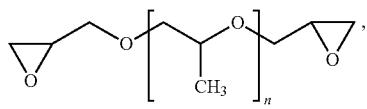

the multi-functional (meth)acryloyl monomer is 2,2,3,3,4,4,5,5-octafluoro-1,6-hexanediol diacrylate:

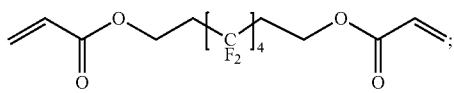

and the predetermined weight ratio is about 50:50.

12. The method as defined in claim 8, wherein:
the multi-functional epoxy monomer is Poly(propylene glycol) diglycidyl ether:

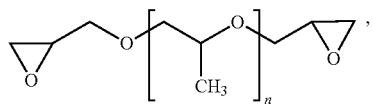

the multi-functional (meth)acryloyl monomer is Glycerol 1,3-diglycerolate diacrylate:

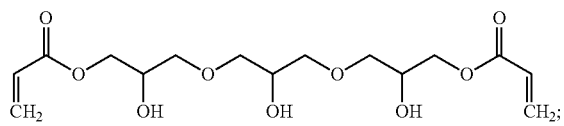 [SMILES: C=CC(=O)OCC(O)COCC(O)COCC(O)COC(=O)C=C]

and the predetermined weight ratio ranges from about 25:75 to about 75:25.

* * * * *

UNITED STATES PATENT AND TRADEMARK OFFICE
CERTIFICATE OF CORRECTION

PATENT NO.         : 11,975,478 B2
APPLICATION NO.    : 17/235244
DATED              : May 7, 2024
INVENTOR(S)        : Alexandre Richez It is certified that error appears in the above-identified patent and that said Letters Patent is hereby corrected as shown below:

In the Claims

In Column 55, Lines 1-21, in Claim 9, delete "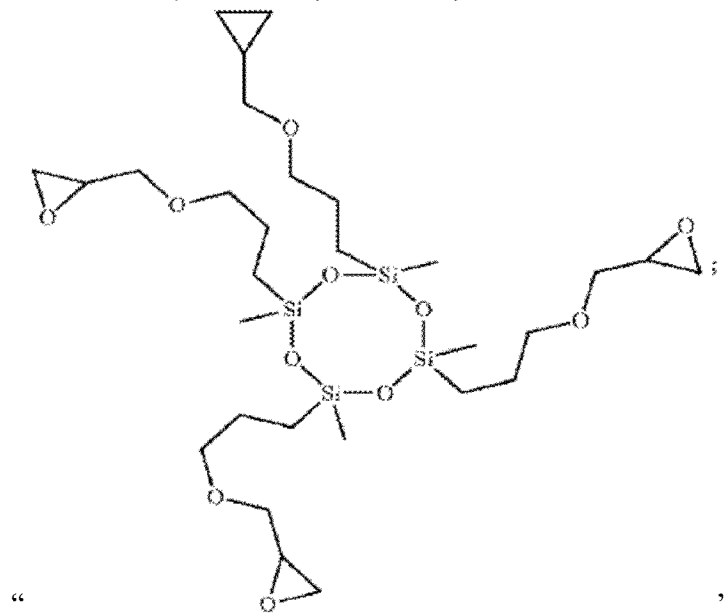" and insert

Signed and Sealed this
Tenth Day of December, 2024

Katherine Kelly Vidal
*Director of the United States Patent and Trademark Office*

CERTIFICATE OF CORRECTION (continued)
U.S. Pat. No. 11,975,478 B2

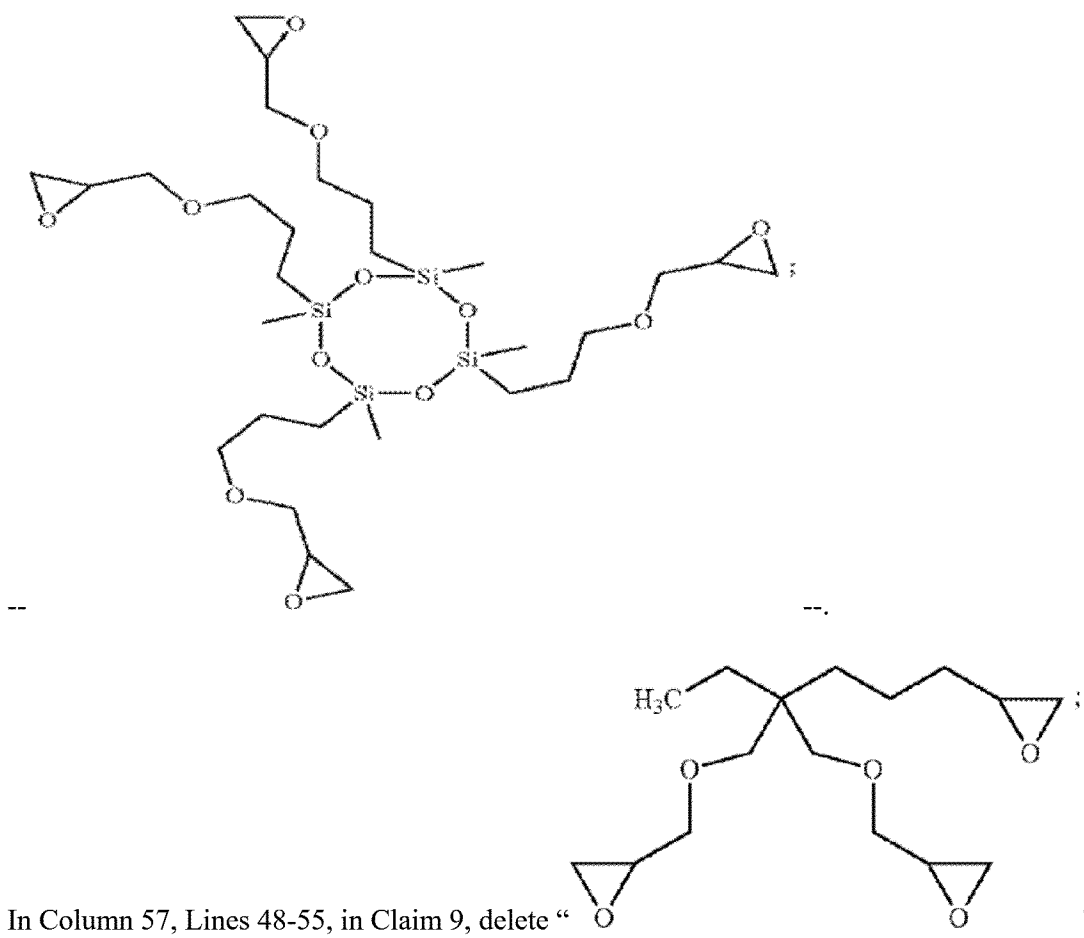

In Column 57, Lines 48-55, in Claim 9, delete " 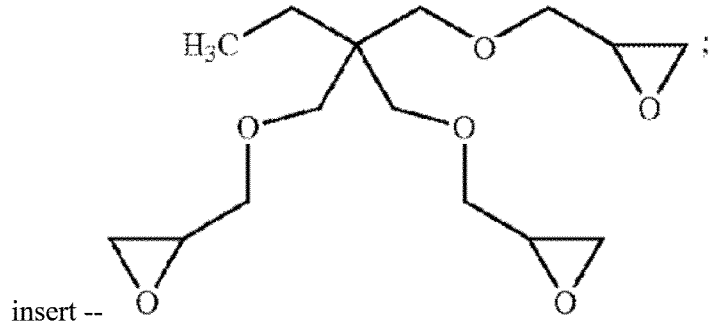 " and insert -- -- .